US011604226B2

(12) United States Patent
Inukai et al.

(10) Patent No.: US 11,604,226 B2
(45) Date of Patent: Mar. 14, 2023

(54) VOLTAGE DETECTING CIRCUIT, ABNORMALITY DETECTOR, AND BATTERY SYSTEM

(71) Applicant: PANASONIC INTELLECTUAL PROPERTY MANAGEMENT CO., LTD., Osaka (JP)

(72) Inventors: Fumihito Inukai, Kyoto (JP); Gorou Mori, Osaka (JP)

(73) Assignee: NUVOTON TECHNOLOGY CORPORATION JAPAN, Kyoto (JP)

( * ) Notice: Subject to any disclaimer, the term of this patent is extended or adjusted under 35 U.S.C. 154(b) by 674 days.

(21) Appl. No.: 15/913,078

(22) Filed: Mar. 6, 2018

(65) Prior Publication Data

US 2018/0196105 A1 Jul. 12, 2018

Related U.S. Application Data

(63) Continuation of application No. PCT/JP2016/004211, filed on Sep. 15, 2016.
(Continued)

(51) Int. Cl.
*G01R 31/36* (2020.01)
*G01R 31/3835* (2019.01)
(Continued)

(52) U.S. Cl.
CPC ......... *G01R 31/3835* (2019.01); *G01R 35/00* (2013.01); *G01R 31/396* (2019.01); *G01R 31/54* (2020.01)

(58) Field of Classification Search
CPC ..................... G01R 31/3835; G01R 31/396
See application file for complete search history.

(56) References Cited

U.S. PATENT DOCUMENTS 7,417,438 B2 * 8/2008 Miyamoto .............. B60L 58/18
324/522
8,330,469 B2 * 12/2012 Miyamoto ......... G01R 31/3835
320/134
(Continued)

FOREIGN PATENT DOCUMENTS

JP 2001-157367 A 6/2001
JP 2002-156392 A 5/2002
(Continued)

OTHER PUBLICATIONS

International Search Report and Written Opinion dated Nov. 22, 2016, issued in International Patent Application No. PCT/JP2016/004211; with partial English translation.
(Continued)

*Primary Examiner* — Walter L Lindsay, Jr.
*Assistant Examiner* — Milton Gonzalez
(74) *Attorney, Agent, or Firm* — McDermott Will & Emery LLP

(57) ABSTRACT

A voltage detection circuit includes a first terminal for connecting to one end of a first voltage detection line through a first resistor, the first voltage detection line having another end connected to a cathode or an anode of a first individual battery; a second terminal for connecting to the one end of the first voltage detection line without the first resistor; a first current generating circuit connected to the first terminal; and a voltage detector which detects a voltage of the first terminal and a voltage of the second terminal. The voltage detector includes at least one first AD converter connected to the first terminal, and at least one second AD converter connected to the second terminal.

14 Claims, 31 Drawing Sheets

Related U.S. Application Data

(60) Provisional application No. 62/219,823, filed on Sep. 17, 2015.

(51) Int. Cl.
  *G01R 35/00* (2006.01)
  *G01R 31/396* (2019.01)
  *G01R 31/54* (2020.01)

(56) References Cited

U.S. PATENT DOCUMENTS

| | | | | |
|---|---|---|---|---|
| 8,384,353 B2* | 2/2013 | Miyazaki | ............ | H01M 10/441 |
| | | | | 320/120 |
| 8,410,757 B2* | 4/2013 | Tsukamoto | .......... | G01R 31/396 |
| | | | | 320/118 |
| 8,547,064 B2* | 10/2013 | Cooper | ................. | H02J 7/0021 |
| | | | | 320/116 |
| 8,797,043 B2* | 8/2014 | Laber | .................... | G01R 31/396 |
| | | | | 324/432 |
| 9,466,993 B2* | 10/2016 | Saito | ..................... | H02J 7/0031 |
| 9,857,432 B2* | 1/2018 | Sugimura | .............. | G01R 31/54 |
| 9,970,990 B2* | 5/2018 | Suzuki | ................. | G01R 31/396 |
| 10,193,194 B2* | 1/2019 | Nakatsuka | ............ | H02J 7/0048 |
| 2011/0169452 A1 | 7/2011 | Cooper et al. | | |
| 2013/0026994 A1 | 1/2013 | Morikawa | | |
| 2014/0084867 A1* | 3/2014 | Hamaoka | ................. | H02J 7/02 |
| | | | | 320/116 |
| 2014/0152261 A1* | 6/2014 | Yamauchi | ............ | G01R 31/396 |
| | | | | 320/118 |
| 2015/0054519 A1* | 2/2015 | Tomonaga | ........... | G01R 31/396 |
| | | | | 324/434 |
| 2015/0077124 A1* | 3/2015 | Suzuki | .................. | H02J 7/0021 |
| | | | | 324/426 |
| 2016/0003914 A1* | 1/2016 | Allen | ..................... | G01R 31/52 |
| | | | | 324/523 |
| 2016/0097818 A1 | 4/2016 | Chiyajo et al. | | |
| 2018/0043781 A1* | 2/2018 | Kanai | ................ | G01R 31/3835 |
| 2018/0052207 A1* | 2/2018 | Kanai | .............. | G01R 19/16542 |

FOREIGN PATENT DOCUMENTS

| | | | |
|---|---|---|---|
| JP | 2009-168705 A | 7/2009 |
| JP | 2011-022155 A | 2/2011 |
| JP | 2012-105492 A | 5/2012 |
| JP | 2013-024800 A | 2/2013 |
| JP | 2013-029362 A | 2/2013 |
| JP | 2013-517755 A | 5/2013 |
| JP | 2014-219277 A | 11/2014 |
| JP | 2015-004542 A | 1/2015 |

OTHER PUBLICATIONS

Japanese Office Action dated Apr. 28, 2020 issued in corresponding Japanese Patent Application No. 2017-540508.

Decision of Refusal dated Nov. 4, 2020 issued in the corresponding Japanese Patent Application No. 2017-540508; with English translation.

Notice of Reasons for Refusal dated Oct. 5, 2021, issued in the corresponding Japanese Patent Application No. 2017-540508; with English translation.

Japanese Office Action dated Apr. 12, 2022, issued in the corresponding Japanese Patent Application No. 2021-015556.

* cited by examiner

| SW1 | | TERMINAL VOLTAGE | | | | | |
|---|---|---|---|---|---|---|---|
| | | VC1 | VCB1 | VC1-VCB1 | VC2 | VCB2 | VC2-VCB2 |
| DURING NON-DISCONNECTION | SW1 = OFF | 3.6 V | 3.6 V | 0 V | 3.6 V | 3.6 V | 0 V |
| | SW1 = ON | 3.6 V | 0 V | 3.6 V | 3.6 V | 5.4 V | -1.8 V |
| DURING DISCONNECTION | SW1 = OFF | 3.6 V | 3.6 V | 0 V | 3.6 V | 3.6 V | 0 V |
| | SW1 = ON | 0 V | 0 V | 0 V | 7.2 V | 7.2 V | 0 V |

VOLTAGE DETECTING CIRCUIT, ABNORMALITY DETECTOR, AND BATTERY SYSTEM

CROSS REFERENCE TO RELATED APPLICATIONS

This application is a U.S. continuation application of PCT International Patent Application Number PCT/JP2016/004211 filed on Sep. 15, 2016, claiming the benefit of priority of U.S. Provisional Application No. 62/219,823 filed on Sep. 17, 2015, the entire contents of which are hereby incorporated by reference.

BACKGROUND

1. Technical Field

The present disclosure relates to voltage detection circuits for detecting voltages of individual batteries, abnormality detectors, and battery systems.

2. Description of the Related Art

Conventionally known battery systems each include individual batteries, and voltage detection circuits connected to the individual batteries to detect the voltages of the individual batteries.

In the case where such battery systems have connection abnormality, such as disconnection, in a voltage detection line which connects an individual battery to a voltage detection circuit, the voltage detection circuit cannot detect a voltage of the individual battery without an error.

Methods of detecting connection abnormality in the voltage detection line are disclosed.

For example, Japanese Unexamined Patent Application Publication No. 2014-219277 discloses a technique of determining whether a voltage detection line has connection abnormality through comparison of the voltage of an individual battery detected before discharge of a capacitor forming a filter circuit connected to the voltage detection line to the voltage of the individual battery detected after discharge of the capacitor.

SUMMARY

The technique described in Japanese Unexamined Patent Application Publication No. 2014-219277 has a time difference between the timing for detecting the voltage of the individual battery before discharge of the capacitor and the timing for detecting the voltage of the individual battery after discharge of the capacitor. In the case where the individual battery voltage varies within a period from the timing for detecting the voltage of the individual battery before discharge of the capacitor and the timing for detecting the voltage of the individual battery after discharge of the capacitor, an error may occur in determination of whether the voltage detection line has connection abnormality or not.

The present disclosure has been made in consideration of such a problem. An object of the present disclosure is to provide a voltage detection circuit, an abnormality detector, and a battery system which can reduce the possibility of an error in determination of whether a voltage detection line has connection abnormality or not.

The voltage detection circuit according to one aspect of the present disclosure is a voltage detection circuit, including: a first terminal for connecting to one end of a first voltage detection line through a first resistor, the first voltage detection line having another end connected to a cathode or an anode of a first individual battery; a second terminal for connecting to the one end of the first voltage detection line without the first resistor; a first current generating circuit connected to the first terminal; and a voltage detector which detects a voltage of the first terminal and a voltage of the second terminal. The voltage detector includes at least one first AD converter connected to the first terminal, and at least one second AD converter connected to the second terminal.

The abnormality detector according to one aspect of the present disclosure is an abnormality detector, including: the voltage detection circuit described above; the first resistor; a fifth terminal for connecting to the one end of the first voltage detection line; a first connection path which connects the first terminal to the fifth terminal through the first resistor; a second connection path which connects the second terminal to the fifth terminal without the first resistor, and an abnormality determination circuit which detects connection abnormality of the first voltage detection line based on the voltage of the first terminal and the voltage of the second terminal.

The battery system according to one aspect of the present disclosure is a battery system, including: the abnormality detector described above; the first individual battery; and the first voltage detection line. The another end of the first voltage detection line is connected to the cathode or the anode of the first individual battery, and the one end of the first voltage detection line is connected to the fifth terminal.

According to the voltage detection circuit, the abnormality detector, and the battery system, a difference in voltage is not generated between the voltage of a first terminal and the voltage of a second terminal in a first voltage detection line having connection abnormality because the one end of the first voltage detection line is not connected to the first individual battery. In contrast, the one end of a first voltage detection line having no connection abnormality is connected to the first individual battery. As a result, the current generated by the first current generating circuit flows into the first resistor, generating a voltage. The voltage causes a difference in voltage between the voltage of the first terminal and the voltage of the second terminal. The voltage detector, the abnormality detector, and the battery system detect the voltage of the first terminal and the voltage of the second terminal.

Thus, the voltage detection circuit, the abnormality detector, and the battery system can determine whether the first voltage detection line has connection abnormality by detecting the difference in voltage, unlike the conventional technique which needs detection of the voltage several times at different timings.

Accordingly, use of the voltage detection circuit, the abnormality detector, and the battery system can reduce the possibility of an error in determination of whether the voltage detection line has connection abnormality or not.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENTS

Figure 1:
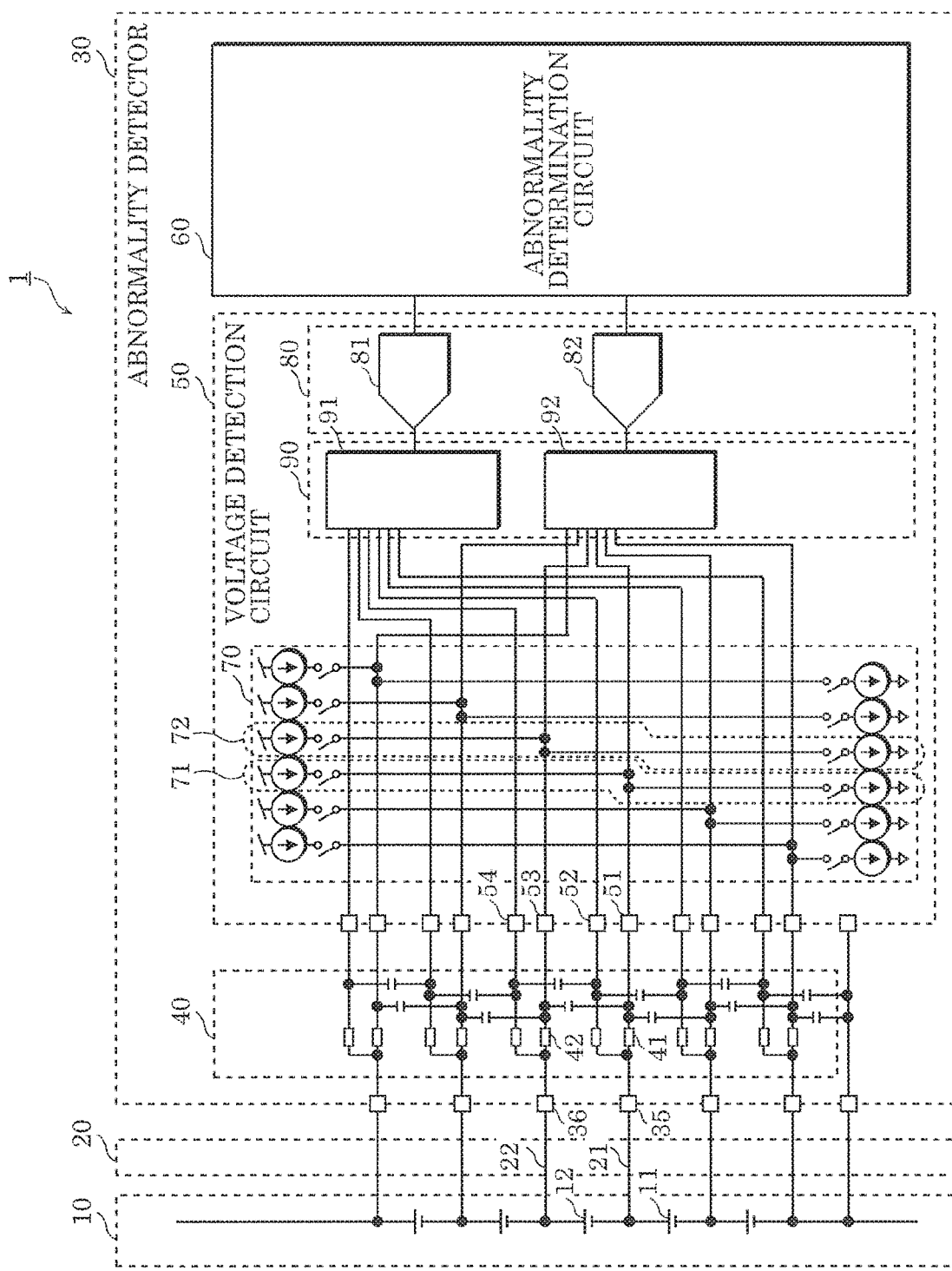
FIG. 1 is a block diagram illustrating a configuration of a battery system according to Embodiment 1.

Specific examples of the battery system according to one aspect of the present disclosure will now be described with reference to the drawings. The embodiments described below illustrate specific examples of the present disclosure. Accordingly, numeral values, shapes, materials, components, arrangements, positions, and connection forms of the components, steps, order of the steps, and the like shown in the embodiments below are only examples, and will not limit the present disclosure. Among the components in the embodiments below, components not described in independent claims expressing the highest concept will be described as arbitrary components.

The diagrams are schematic views, and are not always strictly illustrated. In these diagrams, identical reference numerals are given to substantially identical components, and the duplication of the description will be omitted or simplified.

Embodiment 1

[1-1. Configuration]

FIG. 1 is a block diagram illustrating of a configuration of battery system 1 according to Embodiment 1.

As illustrated in FIG. 1, battery system 1 includes assembled battery 10, voltage detection line group 20, and abnormality detector 30.

Assembled battery 10 includes a plurality of individual batteries including first individual battery 11, and second individual battery 12 connected in series to the cathode of first individual battery 11.

Herein, the individual batteries included in assembled battery 10 are a lithium ion rechargeable battery, for example. The individual batteries do not always need to be a lithium ion rechargeable battery, and may be an electrical double layer capacitor, or an electrolytic capacitor, for example.

In this illustration, five individual batteries are included in assembled battery 10. The number of individual batteries does not always need to be five, and may be two or more, for example, three or seven.

Voltage detection line group 20 includes voltage detection lines connecting cathodes or anodes of the individual batteries included in assembled battery 10 to terminals of abnormality detector 30 one to one.

Voltage detection line group 20 includes first voltage detection line 21 and second voltage detection line 22.

Of one end and another end of first voltage detection line 21, the another end of first voltage detection line 21 is connected to the cathode of first individual battery 11. The another end of first voltage detection line 21 is also connected to the anode of second individual battery 12 connected in series to the cathode of first individual battery 11.

Of one end and another end of second voltage detection line 22, the another end of second voltage detection line 22 is connected to the cathode of second individual battery 12. The another end of second voltage detection line 22 is also connected to the anode of an individual battery connected in series to the cathode of second individual battery 12.

Abnormality detector 30 is a so-called electronic control unit (ECU) for monitoring individual batteries, and has a function to monitor the individual batteries included in assembled battery 10. Abnormality detector 30 includes filter circuit 40, voltage detection circuit 50, and abnormality determination circuit 60.

Abnormality detector 30 also has the terminals connected to the voltage detection lines included in voltage detection line group 20. These terminals include fifth terminal 35 connected to first voltage detection line 21 and sixth terminal 36 connected to second voltage detection line 22.

Filter circuit 40 includes a plurality of low-pass filters for smoothing the voltages of the individual batteries included in assembled battery 10, each low-pass filter being formed by an RC circuit composed of a resistor and a capacitor.

The resistor forming the low-pass filter includes first resistor 41 and second resistor 42.

First resistor 41 is connected to fifth terminal 35.

Second resistor 42 is connected to sixth terminal 36.

Voltage detection circuit 50 includes current generating circuit group 70, voltage detector 80, and multiplexer 90.

Voltage detection circuit 50 has a plurality of terminals connected to filter circuit 40. These terminals include first terminal 51, second terminal 52, third terminal 53, and fourth terminal 54.

First terminal 51 is connected to the one end (end not connected to the cathode of first individual battery 11) of first voltage detection line 21 through first resistor 41.

Second terminal 52 is connected to the one end of first voltage detection line 21 without first resistor 41.

Third terminal 53 is connected to the one end (end not connected to the cathode of second individual battery 12) of second voltage detection line 22 through second resistor 42.

Fourth terminal 54 is connected to the one end of second voltage detection line 22 without second resistor 42.

In other words, abnormality detector 30 includes a first connection path which connects first terminal 51 to fifth terminal 35 through first resistor 41, and a second connection path which connects second terminal 52 to fifth terminal 35 through second resistor 42.

Current generating circuit group 70 includes a plurality of current generating circuits each composed of a combination of a switchable constant current source connected to the power supply potential (hereinafter, referred to as "constant current source for current feeding"), and a switchable constant current source connected to the ground potential (hereinafter, referred to as "constant current source for current extraction"). These current generating circuits include first current generating circuit 71 and second current generating circuit 72.

Here, examples of the power supply potential include the power supply potential of voltage detection circuit 50, the highest potential of voltage detection circuit 50, the potential internally generated within voltage detection circuit 50, and external potential fed from an input terminal from the outside. Examples of the ground potential include the ground potential of voltage detection circuit 50, the lowest potential of voltage detection circuit 50, the potential internally generated within voltage detection circuit 50, and external potential fed from an input terminal from the outside. The external potential may be fed from the assembled battery, for example.

These constant current sources are turned off in the normal state. The constant current sources are turned on only when a specific condition is satisfied in the first abnormality detection processing described later.

First current generating circuit 71 is connected to first terminal 51 to extract current from first terminal 51 or feed current to first terminal 51.

Second current generating circuit 72 is connected to third terminal 53 to extract current from third terminal 53 or feed current to third terminal 53.

Multiplexer 90 includes first multiplexer 91 and second multiplexer 92. Multiplexer 90 selectively transmits one of pairs of voltages to voltage detector 80, the pairs of voltages being a pair of the voltage of first terminal 51 and the voltage of second terminal 52 and a pair of the voltage of third terminal 53 and the voltage of fourth terminal 54.

Here, the voltage of the terminal refers to the potential of a terminal of interest (hereinafter, referred to as "target terminal") where the potential of the anode of an individual battery whose cathode is connected to the target terminal is used as a reference potential. The term "transmit the voltage of the target terminal to voltage detector 80" means that the potential of the target terminal and its reference potential are transmitted to voltage detector 80. In other words, for example, in the case where the target terminal is third terminal 53, multiplexer 90 transmits the potential of third terminal 53 and its reference potential, i.e., the potential of first terminal 51 to voltage detector 80.

Voltage detector 80 includes first AD converter 81 and second AD converter 82. Voltage detector 80 detects the difference between the two voltages in the pair selected by multiplexer 90. In the case where multiplexer 90 selects the pair of the voltage of first terminal 51 and the voltage of second terminal 52, voltage detector 80 converts the voltage of first terminal 51 and the voltage of second terminal 52 into digital values, and then detects the difference in potential. In the case where multiplexer 90 selects the pair of the voltage of third terminal 53 and the voltage of fourth terminal 54, voltage detector 80 converts the voltage of third terminal 53 and the voltage of fourth terminal 54 into digital values, and then detects the difference in potential.

First AD converter 81 detects one voltage (voltage selected by first multiplexer 91) of the pair selected by multiplexer 90, and outputs the digital value of the detected voltage.

In other words, first AD converter 81 detects the difference between the potential of the target terminal and the reference potential of the target terminal, which are transmitted from first multiplexer 91. For example, in the case where first multiplexer 91 selects the voltage of fourth terminal 54, first AD converter 81 detects the voltage of fourth terminal 54 by detecting the difference between the potential of fourth terminal 54 and its reference potential, i.e., the potential of second terminal 52, which are transmitted from first multiplexer 91.

Second AD converter 82 detects the other voltage (voltage selected by second multiplexer 92) of the pair of voltages selected by multiplexer 90, and outputs the digital value of the detected voltage.

In other words, second AD converter 82 detects the difference between the potential of the target terminal and the reference potential of the target terminal, which are transmitted from second multiplexer 92. For example, in the case where second multiplexer 92 selects the voltage of third terminal 53, second AD converter 82 detects the voltage of third terminal 53 by detecting the difference between the potential of third terminal 53 and its reference potential, i.e., the potential of first terminal 51, which are transmitted from second multiplexer 92.

Here, detection of the voltage by first AD converter 81 and detection of the voltage by second AD converter 82 can be performed substantially simultaneously (within 1 ms).

As described above, voltage detection circuit 50 includes two systems of monitoring the voltages of the individual batteries included in assembled battery 10, that is, the main monitoring system including first multiplexer 91 and first AD converter 81, and a sub-monitoring system including second multiplexer 92 and second AD converter 82.

The main monitoring system is mutually connected to the sub-monitoring system through a resistor included in a low-pass filter included in filter circuit 40. The sub-monitoring system is connected to a plurality of current generating circuits included in current generating circuit group 70.

Abnormality determination circuit 60 is implemented through execution of the memory (not illustrated) contained in abnormality detector 30 by a processor included in abnormality detector 30. Based on the difference in potential detected by voltage detection circuit 50, abnormality determination circuit 60 detects the connection abnormality of each of the voltage detection lines (including first voltage detection line 21) included in voltage detection line group 20. More specifically, abnormality determination circuit 60 controls switching of the constant current sources for current feeding and the constant current sources for current extraction included in current generating circuit group 70, the selection between first multiplexer 91 and second multiplexer 92, and the operations of first AD converter 81 and second AD converter 82 to detect the connection abnormality of each of the voltage detection lines included in voltage detection line group 20. The method of detecting connection abnormality will be described later in more detail in the description of the first abnormality detection processing.

Voltage detector 80 may only convert each terminal voltage into a digital value, and abnormality determination circuit 60 may detect the difference in potential and the connection abnormality of each voltage detection line. In other words, voltage detector 80 may only detect each terminal voltage, and abnormality determination circuit 60 may detect the difference in potential and the connection abnormality of each voltage detection line.

The operation of battery system 1 having such a configuration will now be described with reference to the drawings.

[1-2. Operation]

Battery system 1 performs first abnormality detection processing as its characteristic operation.

The first abnormality detection processing is mainly performed by voltage detection circuit 50, where the connection abnormality of a voltage detection line included in voltage detection line group 20 is detected. Any voltage detection line included in voltage detection line group 20 can be the target voltage detection line for the first abnormality detection processing. Here, an example will be described in which first voltage detection line 21 among these voltage detection lines is the target for detection of the connection abnormality.

The connection abnormality in all of the voltage detection lines included in voltage detection line group 20 can be detected, for example, through the first abnormality detection processing sequentially performed on the voltage detection lines included in voltage detection line group 20.

Figure 2:
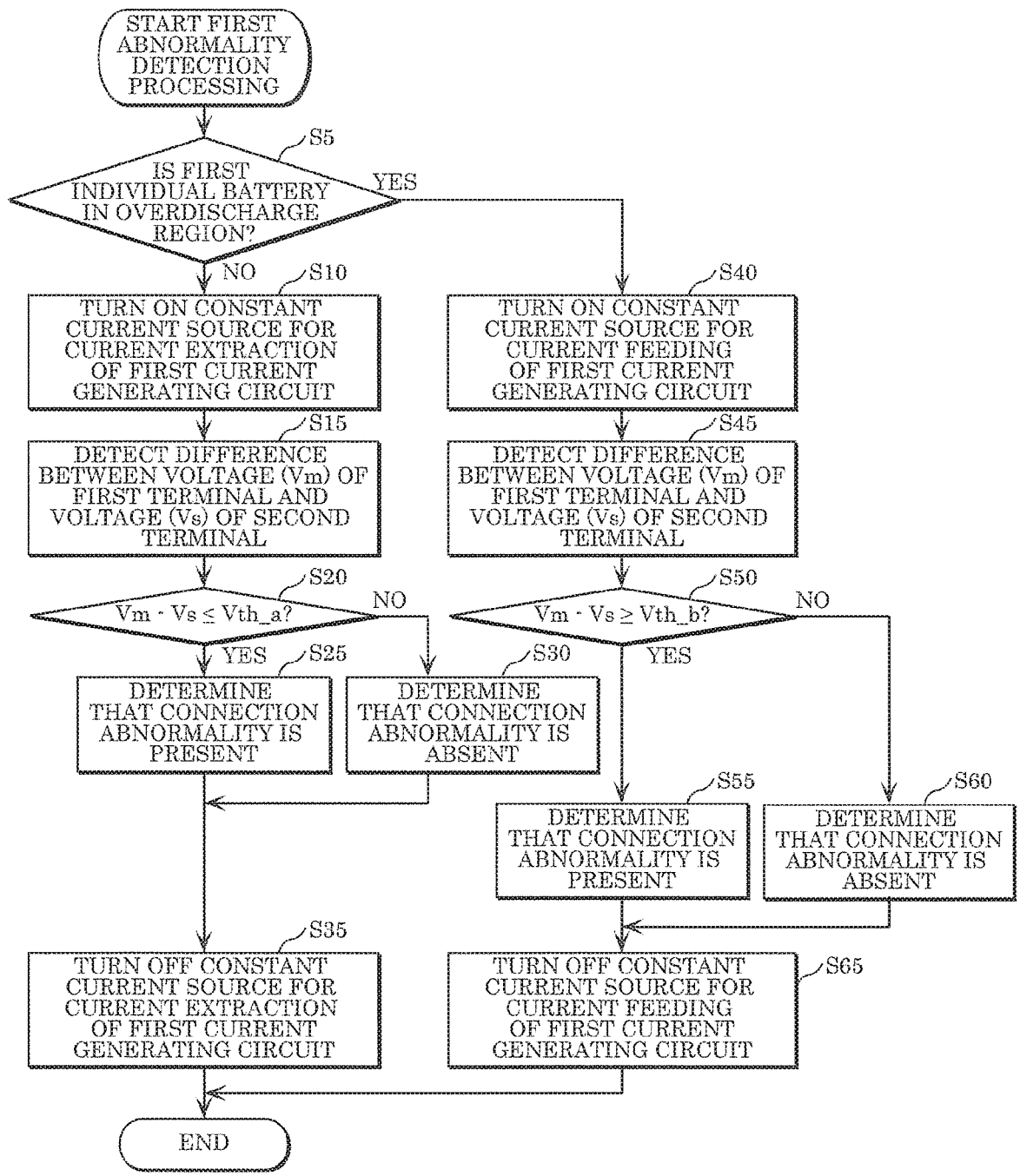
FIG. 2 is a flowchart illustrating first abnormality detection processing.

FIG. 2 is a flowchart illustrating the first abnormality detection processing.

The first abnormality detection processing is started when a predetermined condition is satisfied (for example, when a predetermined time has passed since voltage detection circuit 50 was activated, when a predetermined time has passed since the last first abnormality detection processing was executed, or when a user of voltage detection circuit 50 performs a predetermined operation on voltage detection circuit 50).

After the first abnormality detection processing is started, abnormality determination circuit 60 determines whether first individual battery 11 is in an overdischarge region (Step S5), where the cathode of first individual battery 11 is connected to first voltage detection line 21 as the target voltage detection line for detection of connection abnormality. Here, abnormality determination circuit 60 determines that first individual battery 11 is in the overdischarge region when the latest measured voltage of first individual battery 11 is less than a predetermined value (for example, 1.0 V), and determines that first individual battery 11 is out of the overdischarge region when the latest measured voltage of first individual battery 11 is equal to or more than the predetermined value. Alternatively, for example, abnormality determination circuit 60 may determine that first individual battery 11 is out of the overdischarge region when there is no latest measured voltage of first individual battery 11.

When it is determined in the processing in Step S5 that first individual battery 11 is out of the overdischarge region (Step S5: No), abnormality determination circuit 60 turns on the constant current source for current extraction of first current generating circuit 71 (Step S10), where first current generating circuit 71 is connected to first voltage detection line 21 as the target voltage detection line for detection of connection abnormality.

Abnormality determination circuit 60 then controls the selection between first multiplexer 91 and second multiplexer 92, and causes multiplexer 90 to select the pair of the voltage of first terminal 51 and the voltage of second terminal 52. Abnormality determination circuit 60 controls the operations of first AD converter 81 and second AD converter 82 to cause voltage detector 80 to operate first AD converter 81 and second AD converter 82 at a substantially identical timing (within 1 ms). The difference (Vm−Vs) between the voltage of second terminal 52 (voltage Vm detected in the main monitoring system) and the voltage of first terminal 51 (voltage Vs detected in the sub-monitoring system) is thereby detected (Step S15).

When difference (Vm−Vs) between voltage Vm of second terminal 52 and voltage Vs of first terminal 51 is detected, abnormality determination circuit 60 determines whether the value of difference (Vm−Vs) is equal to or less than a predetermined abnormality determination value (threshold) Vth_a (for example, 0.5 V) (Step S20).

When the value of difference (Vm−Vs) is equal to or less than Vth_a in the processing in Step S20 (Step S20: Yes), abnormality determination circuit 60 determines that first voltage detection line 21 has connection abnormality (Step S25).

When the value of difference (Vm−Vs) is more than Vth_a in the processing in Step S20 (Step S20: No), abnormality determination circuit 60 determines that first voltage detection line 21 has no connection abnormality (Step S30).

When the processing in Step S25 or S30 is completed, abnormality determination circuit 60 turns off the constant current source for current extraction of first current generating circuit 71 (Step S35).

With reference to the drawings, the determination of the presence/absence of the connection abnormality by abnormality determination circuit 60 in the processings from Step S5: Yes to Step S35 will now be described in more detail.

Figure 3A:
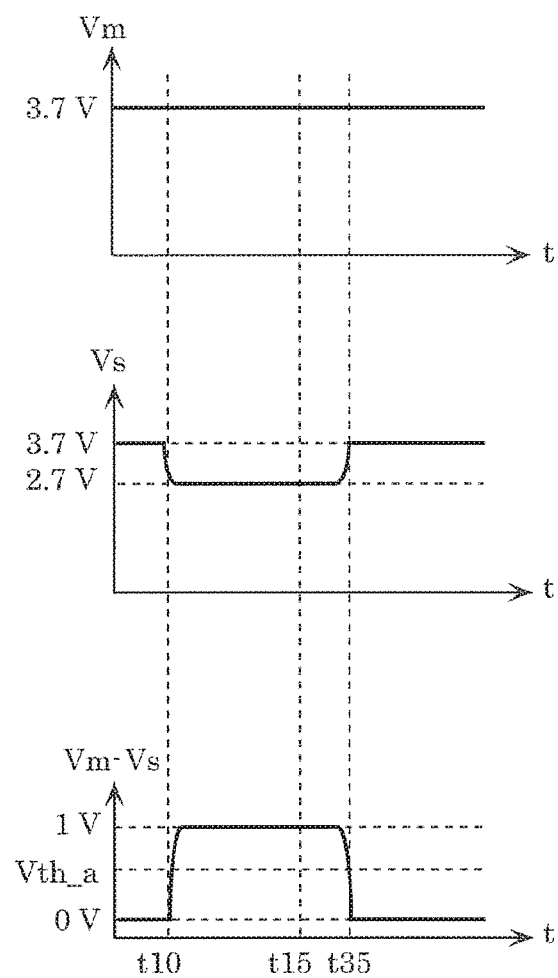
FIG. 3A is a schematic pattern diagram illustrating a transition of the voltage in first abnormality detection processing.

FIG. 3A is a schematic pattern diagram illustrating a transition of voltage Vm detected in the main monitoring system, a transition of voltage Vs detected in the sub-monitoring system, and a transition of difference (Vm−Vs) in the case where first voltage detection line 21 has no connection abnormality caused by disconnection.

Figure 3B:
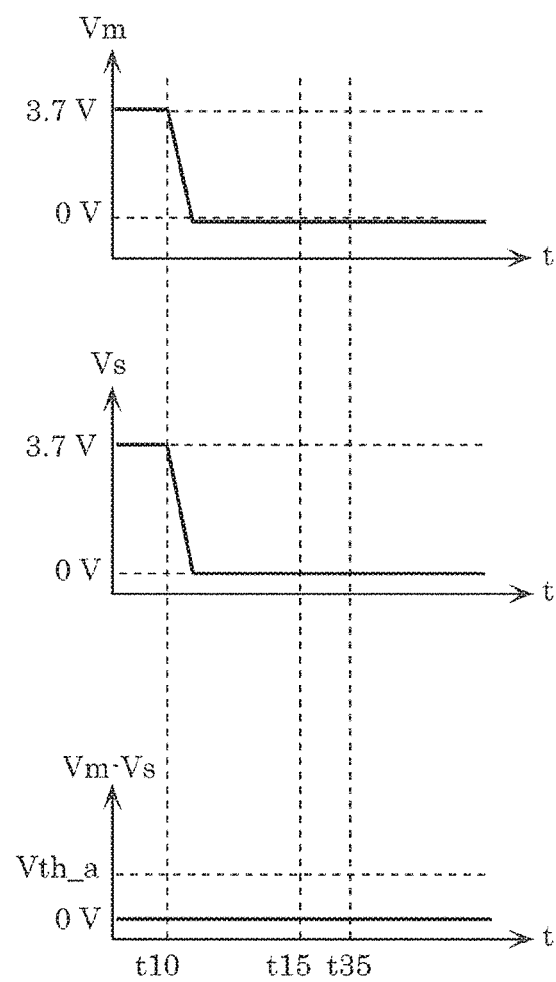
FIG. 3B is another schematic pattern diagram illustrating a transition of the voltage in the first abnormality detection processing.

FIG. 3B is another schematic pattern diagram illustrating a transition of voltage Vm detected in the main monitoring system, a transition of voltage Vs detected in the sub-monitoring system, and a transition of difference (Vm−Vs) in the case where first voltage detection line 21 has connection abnormality caused by disconnection.

Here, first individual battery 11 has a voltage of 3.7 V. In the filters included in filter circuit 40, Rm=50Ω (hereinafter, the resistor generating this resistance value is also referred to as "resistor m") and Cm=10 nF as the filter constants of the main monitoring system, and Rs=1 KΩ (the resistor generating this resistance value is first resistor 41) and Cs=10 nF as the filter coefficients of the sub-monitoring system. The constant current source for current extraction of first current generating circuit 71 has a current of 1 mA.

The time at which the constant current source for current extraction of first current generating circuit 71 is turned on in the processing in Step S10 is defined as time t10. The time at which difference (Vm−Vs) is detected in the processing in Step S15 is defined as time t15. The time at which the constant current source for current extraction of first current generating circuit 71 is turned off in the processing in Step S35 is defined as time t35.

(a) When first voltage detection line 21 has no connection abnormality caused by disconnection (see FIG. 3A), voltage Vm detected in the main monitoring system remains 3.7 V (voltage of individual battery 11) even when the constant current source for current extraction of first current generating circuit 71 is turned on at time t10. In contrast, when the constant current source for current extraction of first current generating circuit 71 is turned on at time t10, voltage Vs detected in the sub-monitoring system decreases from the voltage of individual battery 11 (3.7 V) to 2.7 V, which is obtained by subtraction of the voltage (1 V (=1 KΩ×1 mA)) generated as a result of a constant current (1 mA) flowing into first resistor 41 (1 KΩ). For this reason, difference (Vm−Vs) detected at time t15 is 1 V.

In contrast, (b) when first voltage detection line 21 has connection abnormality caused by disconnection (see FIG. 3B) and the constant current source for current extraction of first current generating circuit 71 is turned on at time t10, first terminal 51 is in a high impedance state without being connected to the cathode of first individual battery 11. For this reason, the potential of first terminal 51 decreases to an extent that the current is no longer extracted by the constant current source for current extraction of first current generating circuit 71. For this reason, voltage Vs detected in the sub-monitoring system decreases to a lower limit value detectable by second AD converter 82 (for example, 0 V in this case). Similarly, second terminal 52 is also in a high impedance state without being connected to the cathode of first individual battery 11, the potential of second terminal 52 decreases to an extent that the current is no longer extracted by the constant current source for current extraction of first current generating circuit 71. For this reason, voltage Vm detected in the main monitoring system also decreases to a lower limit value detectable by first AD converter 81 (for example, 0 V in this case). For this reason, difference (Vm−Vs) detected at time t15 is 0 V.

Accordingly, the presence/absence of the connection abnormality caused by disconnection can be detected by setting abnormality determination value Vth_a at 0.5 V, for example.

Because the value of difference (Vm−Vs) varies according to the constant of the filter circuit and the current value of the constant current source, abnormality determination value Vth_a may also be set such that these conditions are satisfied.

Returning to FIG. 2, the description of the first abnormality detection processing will now be resumed.

When it is determined in the processing in Step S5 that first individual battery 11 is in the overdischarge region (for example, 1.0 V) (Step S5: Yes), abnormality determination circuit 60 turns on the constant current source for current feeding of first current generating circuit 71 (Step S40), where first current generating circuit 71 is connected to first voltage detection line 21 as a target voltage detection line for detection of connection abnormality.

Abnormality determination circuit 60 then controls the selection between first multiplexer 91 and second multiplexer 92, and causes multiplexer 90 to select the pair of the voltage of first terminal 51 and the voltage of second terminal 52. Abnormality determination circuit 60 then controls the operations of first AD converter 81 and second AD converter 82 to operate first AD converter 81 and second AD converter 82 at a substantially identical timing (within 1 ms). Voltage detector 80 thereby detects difference (Vm−Vs) between the voltage of second terminal 52 (voltage Vm detected in the main monitoring system) and the voltage of first terminal 51 (voltage Vs detected in the sub-monitoring system) (Step S45).

When difference (Vm−Vs) between voltage Vm of second terminal 52 and voltage Vs of first terminal 51 is detected, abnormality determination circuit 60 determines whether the value of difference (Vm−Vs) is equal to or more than a predetermined abnormality determination value (threshold) Vth_b (for example, −0.5 V) (Step S50).

When the value of difference (Vm−Vs) is equal to or more than Vth_b in the processing in Step S50 (Step S50: Yes), abnormality determination circuit 60 determines that first voltage detection line 21 has connection abnormality (Step S55).

When the value of difference (Vm−Vs) is less than Vth in the processing in Step S50 (Step S50: No), abnormality determination circuit 60 determines that first voltage detection line 21 has no connection abnormality (Step S60).

When the processing in Step S55 or Step S60 is completed, abnormality determination circuit 60 turns off the constant current source for current feeding of first current generating circuit 71 (Step S65).

With reference to the drawings, the determination of the presence/absence of connection abnormality by abnormality determination circuit 60 in the processings from Step S5: No to Step S65 will now be described in more detail.

Figure 4A:
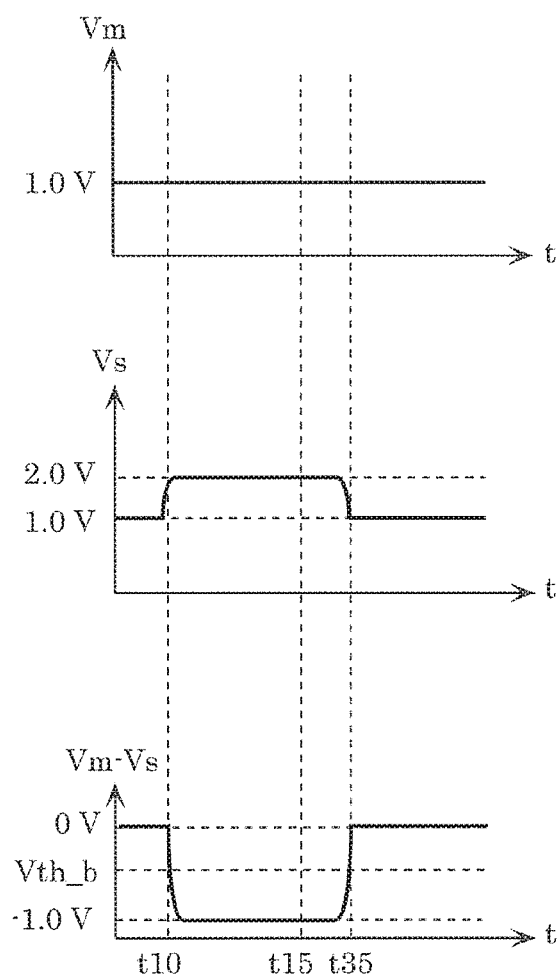
FIG. 4A is a schematic pattern diagram illustrating a transition of the voltage in the first abnormality detection processing.

FIG. 4A is a schematic pattern diagram illustrating a transition of voltage Vm detected in the main monitoring system, a transition of voltage Vs detected in the sub-monitoring system, and a transition of difference (Vm−Vs) when first voltage detection line 21 has no connection abnormality caused by disconnection.

Figure 4B:
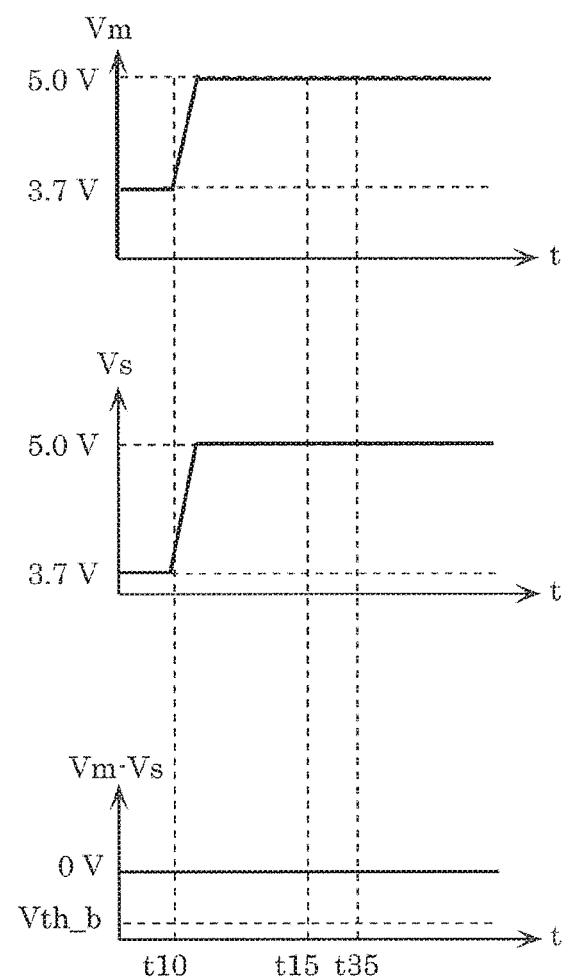
FIG. 4B is another schematic pattern diagram illustrating a transition of the voltage in the first abnormality detection processing.

FIG. 4B is a schematic pattern diagram illustrating a transition of voltage Vm detected in the main monitoring system, a transition of voltage Vs detected in the sub-monitoring system, and a transition of difference (Vm−Vs) when first voltage detection line 21 has connection abnormality caused by disconnection.

(a) When first voltage detection line 21 has no connection abnormality caused by disconnection (see FIG. 4A), voltage Vm detected in the main monitoring system remains 3.7 V (voltage of individual battery 11) even when the constant current source for current feeding of first current generating circuit 71 is turned on at time t10. In contrast, when the constant current source for current feeding of first current generating circuit 71 is turned on at time t10, voltage Vs detected in the sub-monitoring system increases from the voltage of individual battery 11 (1.0 V) to 2.0 V, which is obtained by addition of the voltage (1 V (=1 KΩ×1 mA)) generated as a result of a constant current (1 mA) flowing into first resistor 41 (1 KΩ). For this reason, difference (Vm−Vs) detected at time t15 is −1 V.

In contrast, (b) when first voltage detection line 21 has connection abnormality caused by disconnection (see FIG. 4B) and the constant current source for current feeding of first current generating circuit 71 is turned on at time t10, first terminal 51 is in a high impedance state without being connected to the cathode of first individual battery 11. For this reason, the potential of first terminal 51 increases to an extent that the current is no longer fed by the constant current source for current feeding of first current generating circuit 71. For this reason, voltage Vm detected by the sub-monitoring system increases to an upper limit value detectable by the AD converter (for example, 5 V in this case). Similarly, second terminal 52 is also in a high impedance state without being connected to the cathode of first individual battery 11, and the potential of second terminal 52 increases to an extent that the current is no longer fed by the constant current source for current feeding of first current generating circuit 71. For this reason, voltage Vs detected by the main monitoring system also increases to an upper limit value detectable by the AD converter (for example, 5 V in this case). For this reason, difference (Vm−Vs) detected at time t15 is 0 V.

Accordingly, the presence/absence of connection abnormality caused by disconnection can be detected by setting abnormality determination value Vth_b at −0.5 V, for example.

Because the value of difference (Vm−Vs) varies according to the constant of the filter circuit and the current value of the constant current source, abnormality determination value Vth_b may also be set such that these conditions are satisfied.

Returning to FIG. 2, the description of the first abnormality detection processing will now be resumed.

When the processing in Step S35 or Step S65 is completed, voltage detection circuit 50 terminates the first abnormality detection processing.

[1-3. Advantageous Effects]

Battery system 1 described above substantially simultaneously (within 1 ms) executes the detection of the voltage of second terminal 52 by first AD converter 81 in the main monitoring system and the detection of the voltage of first terminal 51 by second AD converter 82 in the sub-monitoring system. For this reason, the detection of the voltage is barely affected by a variation in individual battery voltage caused by charge and discharge of individual battery 11 during a period between the detection timing for the voltage of first terminal 51 and that for the voltage of second terminal 52, achieving the detection of connection abnormality with high precision.

It is unnecessary to store the detected voltage values in the past in a memory region, such as a random access memory (RAM), for detection of connection abnormality. For this reason, software is relatively easily designed.

Furthermore, when the target voltage detection line has no abnormality during execution of the first abnormality detection processing, turn-on of the current generating circuit affects the sub-monitoring system but not the main monitoring system. For this reason, the main monitoring system can precisely measure the voltages of the individual batteries included in assembled battery 10 even during execution of the first abnormality detection processing.

Embodiment 2

The battery system according to Embodiment 2 as one aspect of the present disclosure will now be described, in which part of the configuration of battery system 1 according to Embodiment 1 is modified.

Battery system 1 according to one example of Embodiment 1 includes current generating circuit group 70 including current generating circuits, each of the current generating circuits including both of a constant current source for current feeding and a constant current source for current extraction. In contrast, in an exemplary battery system according to Embodiment 2, each of the current generating circuits included in the current generating circuit group includes only the constant current source for current extraction but not the constant current source for current feeding.

Mainly the differences between the battery system and battery system 1 according to Embodiment 1 will now be described in detail with reference to the drawings.

[2-1. Configuration]

Figure 5:
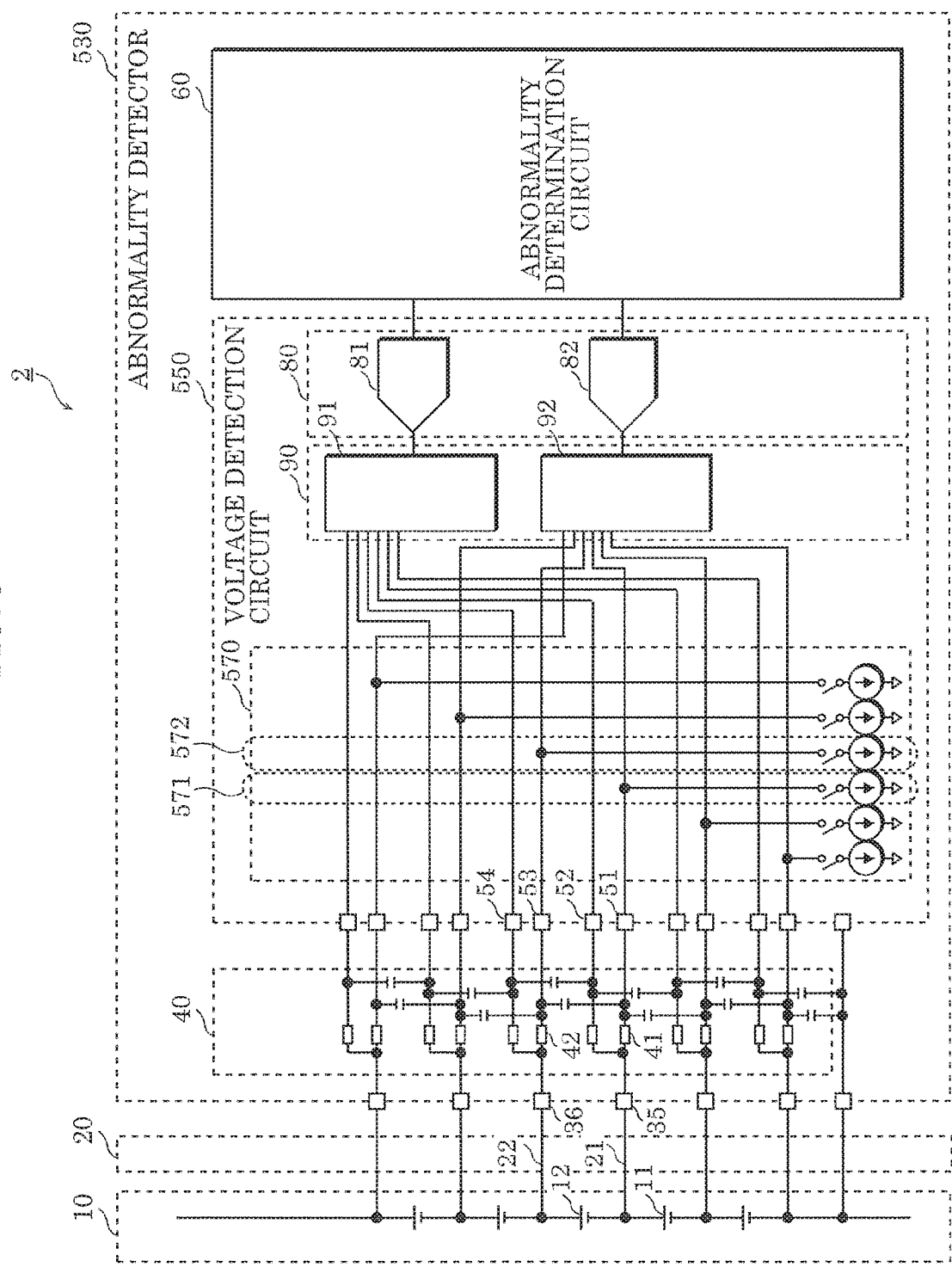
FIG. 5 is a block diagram illustrating a configuration of a battery system according to Embodiment 2.

FIG. 5 is a block diagram illustrating a configuration of battery system 2 according to Embodiment 2.

Battery system 2 is a modification of battery system 1 according to Embodiment 1 where current generating circuit group 70 in Embodiment 1 is replaced with current generating circuit group 570. Accompanied by this modification, voltage detection circuit 50 and abnormality detector 30 corresponding to the outer boxes of current generating circuit group 70 in Embodiment 1 are replaced with voltage detection circuit 550 and abnormality detector 530, respectively.

Current generating circuit group 570 includes a plurality of current generating circuits connected to ground potentials, each of the current generating circuits including a switchable constant current source for current extraction.

In other words, current generating circuit group 570 is composed of current generating circuit group 70 according to Embodiment 1 without the constant current sources for current feeding in the current generating circuits included in current generating circuit group 70.

These current generating circuits each include first current generating circuit 571 corresponding to first current generating circuit 71 according to Embodiment 1 without the constant current sources for current feeding, and second current generating circuit 572 corresponding to second current generating circuit 72 according to Embodiment 1 without the constant current sources for current feeding. The operation of battery system 2 having the above configuration will now be described with reference to the drawings.

[2-2. Operation]

As its characteristic operation, battery system 2 executes the second abnormality detection processing, which is a partial modification of the first abnormality detection processing in Embodiment 1, and the third abnormality detection processing, which is a partial modification of the second abnormality detection processing. These processings will now be described in sequence.

[2-2-1. Second Abnormality Detection Processing]

Figure 6:
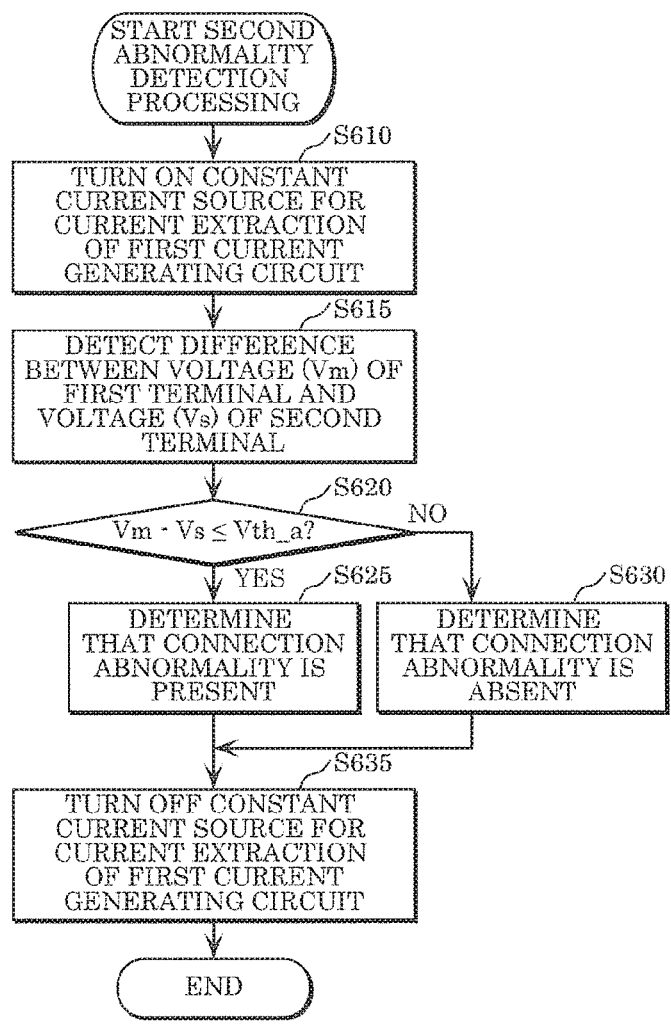
FIG. 6 is a flowchart illustrating second abnormality detection processing.

FIG. 6 is a flowchart illustrating the second abnormality detection processing.

In FIG. 6, the processing in Step S610 corresponds to the processing in Step S10 of the first abnormality detection processing in Embodiment 1, where "first current generating circuit 71" is replaced with "first current generating circuit 571". The processings in Steps S615 to S635 correspond to the processings in Steps S15 to S35 of the first abnormality detection processing in Embodiment 1, respectively.

For this reason, the processings in Steps S610 to S635 are substantially similar to those in Steps S10 to S35 of the first abnormality detection processing in Embodiment 1. Accordingly, these processings have been already described above, and the duplication of the description will be omitted.

In this specification, the second abnormality detection processing will be described where the lower limit value detectable by first AD converter 81 and the lower limit value detectable by second AD converter 82 are 0 V, for example (as in the description of the first abnormality detection processing in Embodiment 1).

In an example of such a configuration, for example, when the voltage of first individual battery 11 is in the overdischarge region (for example, 1.0 V or less) and first voltage detection line 21 has no disconnection, the voltage of first terminal 51 is 0 V or less, which is lower than the lower limit value of the voltage detectable by the sub-monitoring system. In contrast, for example, the connection abnormality can be detected without an error by setting the lower limit value detectable by first AD converter 81 and the lower limit value detectable by second AD converter 82 to −2 V, for example, even when the individual battery voltage is in the overdischarge region, i.e., 1.0 V or less.

[2-2-2. Third Abnormality Detection Processing]

In the second abnormality detection processing, the connection abnormality of the target voltage detection line is examined by utilizing the voltage of the individual battery whose cathode is connected to the target voltage detection line for the detection of connection abnormality. A representative example has been described in which the connection abnormality of first voltage detection line 21 is examined by utilizing the voltage of first individual battery 11 whose cathode is connected to first voltage detection line 21.

In contrast, in the third abnormality detection processing, the connection abnormality of the target voltage detection line is examined by utilizing the voltage of the individual battery whose anode is connected to the target voltage detection line for detection of connection abnormality. A representative example will be described in which the connection abnormality of first voltage detection line 21 is examined by utilizing the voltage of second individual battery 12 whose anode is connected to the target first voltage detection line.

Figure 7:
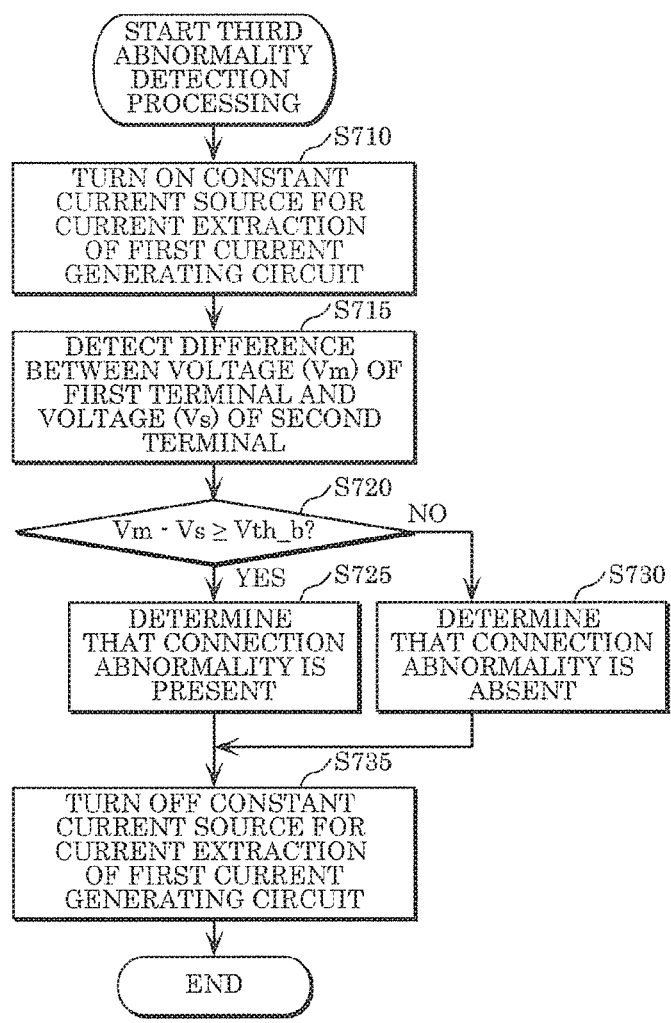
FIG. 7 is a flowchart illustrating third abnormality detection processing.

FIG. 7 is a flowchart illustrating the third abnormality detection processing.

The third abnormality detection processing is started when a predetermined condition is satisfied (for example, when a predetermined time has passed since voltage detection circuit 550 was activated, when a predetermined time has passed since the last third abnormality detection processing was executed, or when a user of voltage detection circuit 550 performs a predetermined operation on voltage detection circuit 550).

When the third abnormality detection processing is started, abnormality determination circuit 60 turns on the constant current source for current extraction of first current generating circuit 71 connected to first voltage detection line 21 as the target voltage detection line for detection of connection abnormality (Step S710).

Abnormality determination circuit 60 then controls the selection between first multiplexer 91 and second multiplexer 92, and causes multiplexer 90 to select the pair of the voltage of third terminal 53 and the voltage of fourth terminal 54. Abnormality determination circuit 60 then controls the operations of first AD converter 81 and second AD converter 82, and causes voltage detector 80 to operate first AD converter 81 and second AD converter 82 at a substantially identical timing (within 1 ms). Difference (Vm−Vs) between the voltage of fourth terminal 54 (voltage Vm detected in the main monitoring system) and the voltage of third terminal 53 (voltage Vs detected in the sub-monitoring system) is thereby detected (Step S715).

When difference (Vm−Vs) between voltage Vm of fourth terminal 54 and voltage Vs of third terminal 53 is detected, abnormality determination circuit 60 determines whether the value of difference (Vm−Vs) is equal to or more than a predetermined abnormality determination value (threshold) Vth_b (for example, −0.5 V) (Step S720).

When the value of difference (Vm−Vs) is equal to or more than Vth_b in the processing in Step S720 (Step S720: Yes), abnormality determination circuit 60 determines that first voltage detection line 21 has connection abnormality (Step S725).

When the value of difference (Vm−Vs) is less than Vth_b in the processing in Step S720 (Step S720: No), abnormality determination circuit 60 determines that first voltage detection line 21 has no connection abnormality (Step S730).

When the processing in Step S725 or S730 is completed, abnormality determination circuit 60 turns off the constant current source for current extraction of first current generating circuit 71 (Step S735).

The determination of the presence/absence of connection abnormality by abnormality determination circuit 60 in the processings from Steps S710 to S735 will now be described in more detail with reference to the drawings.

Figure 8A:
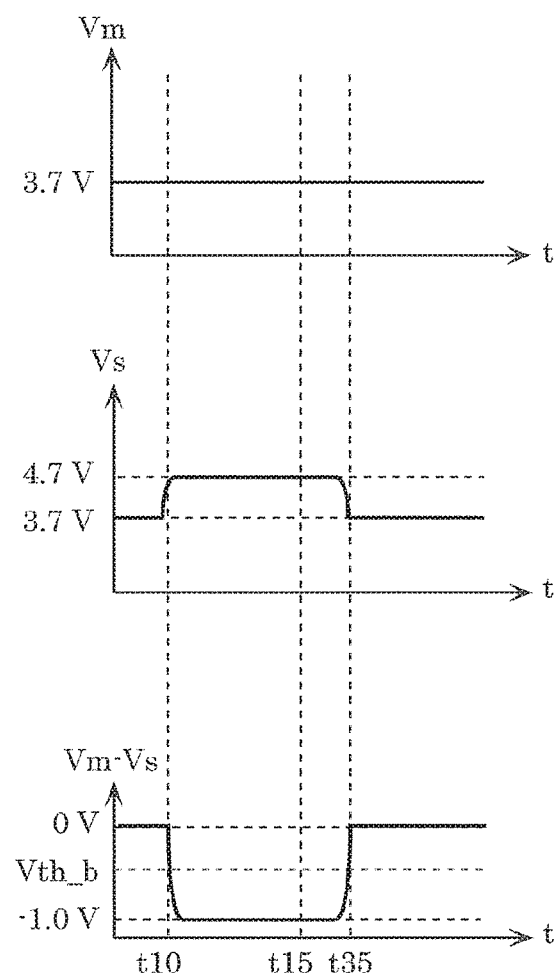
FIG. 8A is a schematic pattern diagram illustrating a transition of the voltage in the third abnormality detection processing.

FIG. 8A is a schematic pattern diagram illustrating a transition of voltage Vm detected in the main monitoring system, a transition of voltage Vs detected in the sub-monitoring system, and a transition of difference (Vm−Vs) when first voltage detection line 21 has no connection abnormality caused by disconnection.

Figure 8B:
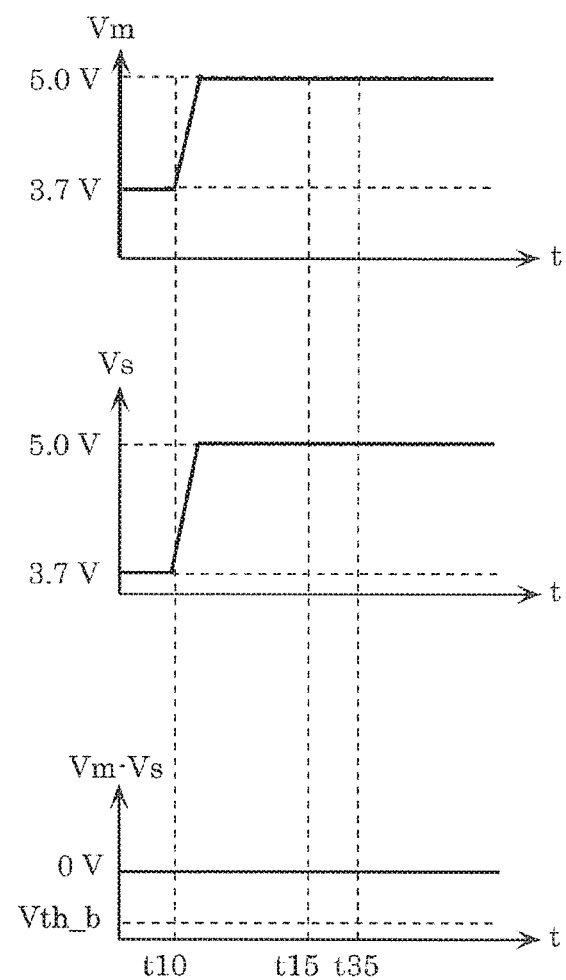
FIG. 8B is another schematic pattern diagram illustrating a transition of the voltage in the third abnormality detection processing.

FIG. 8B is a schematic pattern diagram illustrating a transition of voltage Vm detected in the main monitoring system, a transition of voltage Vs detected in the sub-monitoring system, and a transition of difference (Vm−Vs) when first voltage detection line 21 has connection abnormality caused by disconnection.

(a) When first voltage detection line 21 has no connection abnormality caused by disconnection (see FIG. 8A), voltage Vm detected in the main monitoring system remains 3.7 V (voltage of individual battery 12) even when the constant current source for current extraction of first current generating circuit 71 is turned on at time t10. In contrast, when the constant current source for current extraction of first current generating circuit 71 is turned on at time t10, voltage Vs detected in the sub-monitoring system increases from the voltage of individual battery 12 (3.7 V) to 4.7 V, which is obtained by addition of the voltage (1 V (=1 KΩ×1 mA)) generated as a result of the constant current (1 mA) flowing into first resistor 41 (1 KΩ). For this reason, difference (Vm−Vs) detected at time t15 is −1 V.

In contrast, (b) when first voltage detection line 21 has connection abnormality caused by disconnection (see FIG. 8B) and the constant current source for current feeding of first current generating circuit 71 is turned on at time t10, third terminal 53 is in a high impedance state without being connected to the anode of second individual battery 12. For this reason, the potential of third terminal 53 increases to an extent that the current is no longer fed by the constant current source for current extraction of first current generating circuit 71. For this reason, voltage Vs detected in the sub-monitoring system increases to an upper limit value detectable by the AD converter (for example, 5 V in this case). Similarly, fourth terminal 54 is also in a high impedance state without being connected to the anode of second individual battery 12, and the potential of fourth terminal 54 also increases to an extent that the current is no longer fed by the constant current source for current feeding of first current generating circuit 71. For this reason, voltage Vm detected in the main monitoring system also increases to an upper limit value detectable by the AD converter (for example, 5 V in this case). Accordingly, difference (Vm−Vs) detected at time t15 is 0 V.

Accordingly, the presence/absence of connection abnormality caused by disconnection can be detected by setting abnormality determination value Vth_n at −0.5 V, for example.

Because the value of difference (Vm−Vs) varies according to the constant of the filter circuit and the current value of the constant current source, abnormality determination value Vth_b may also be set such that these conditions are satisfied.

[2-3. Advantageous Effects]

Battery system 2 described above can achieve the same advantageous effects as those of battery system 1 according to Embodiment 1.

Embodiment 3

The battery system according to Embodiment 3 as one aspect of the present disclosure will now be described, in which part of the configuration of battery system 1 according to Embodiment 1 is modified.

Battery system 1 according to Embodiment 1, as one example, includes current generating circuit group 70 including current generating circuits, each of the current generating circuits including both of a constant current source for current feeding and a constant current source for current extraction. In contrast, in an exemplary battery system according to Embodiment 3, each of the current generating circuits included in the current generating circuit group includes only the constant current source for current feeding but not the constant current source for current extraction.

Mainly the differences between the battery system and battery system 1 according to Embodiment 1 will now be described in detail with reference to the drawings.

[3-1. Configuration]

Figure 9:
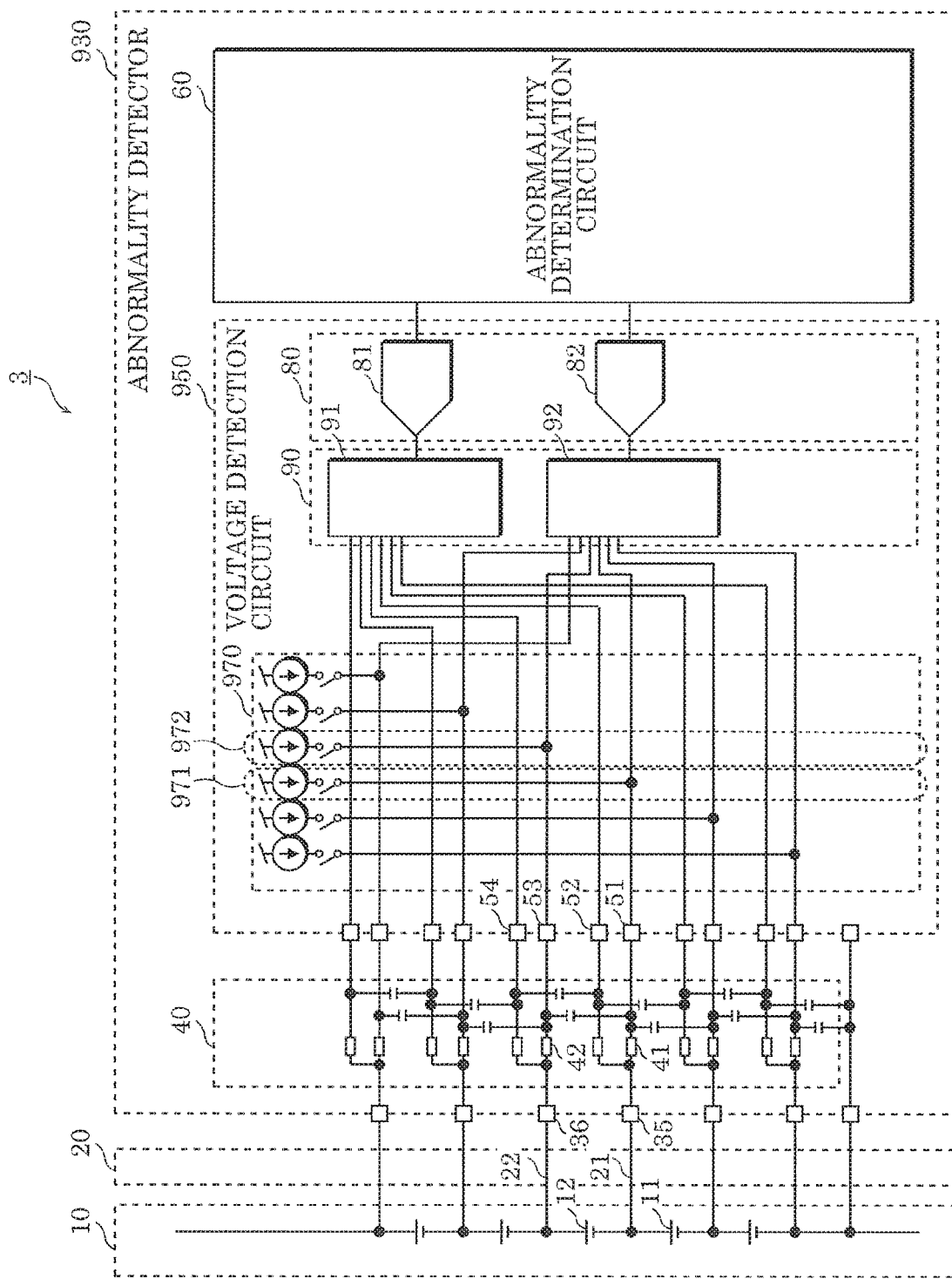
FIG. 9 is a block diagram illustrating a configuration of a battery system according to Embodiment 3.

FIG. 9 is a block diagram illustrating a configuration of battery system 3 according to Embodiment 3.

Battery system 3 is a modification of battery system 1 according to Embodiment 1 where current generating circuit group 70 in Embodiment 1 is replaced with current generating circuit group 970. Accompanied by this modification, voltage detection circuit 50 and abnormality detector 30 corresponding to the outer boxes of current generating circuit group 70 in Embodiment 1 are replaced with voltage detection circuit 950 and abnormality detector 930, respectively.

Current generating circuit group 970 includes a plurality of current generating circuits connected to power supply potentials, each of the current generating circuits including a switchable constant current source for current feeding.

In other words, current generating circuit group 970 is composed of current generating circuit group 70 in Embodiment 1 without the constant current sources for current extraction included in the current generating circuits in current generating circuit group 70.

These current generating circuits each include first current generating circuit 971 corresponding to first current generating circuit 71 according to Embodiment 1 without the constant current sources for current extraction, and second current generating circuit 972 corresponding to second current generating circuit 72 according to Embodiment 1 without the constant current sources for current extraction.

The operation of battery system 3 having the above configuration will now be described with reference to the drawings.

[3-2. Operation]

As its characteristic operation, battery system 3 executes the fourth abnormality detection processing, which is a partial modification of the first abnormality detection processing in Embodiment 1. The processing will now be described in sequence.

Figure 10:
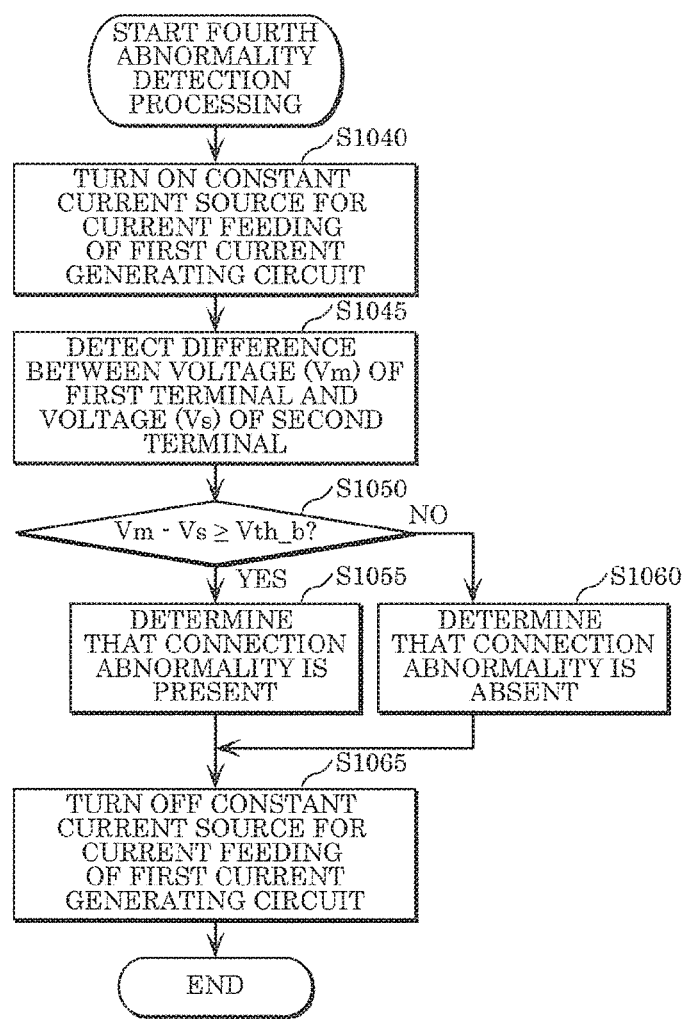
FIG. 10 is a flowchart illustrating fourth abnormality detection processing.

FIG. 10 is a flowchart illustrating the fourth abnormality detection processing.

In FIG. 10, the processing in Step S1040 corresponds to the processing in Step S40 in the first abnormality detection processing in Embodiment 1, where "first current generating circuit 71" is replaced with "first current generating circuit 971". The processings from Steps S1045 to S1065 correspond to the processings in Steps S45 to S65 of the first abnormality detection processing in Embodiment 1, respectively.

For this reason, the processings in Steps S1040 to S1065 are substantially similar to those in Steps S40 to S65 of the first abnormality detection processing in Embodiment 1. Accordingly, these processings have been already described above, and the duplication of the description will be omitted.

In this specification, the second abnormality detection processing will be described where the upper limit value detectable by first AD converter 81 and the upper limit value detectable by second AD converter 82 are 5.0 V, for example (as in the description of the first abnormality detection processing in Embodiment 1).

In an example of such a configuration, for example, when the voltage of first individual battery 11 is in the overcharge region (for example 4.0 V or more) and first voltage detection line 21 has no disconnection, the voltage of first terminal 51 is 5.0 V or more, which is higher than the upper limit value of the voltage detectable by the sub-monitoring system. In contrast, for example, the connection abnormality can be detected without an error by setting the upper limit value detectable by first AD converter 81 and the upper limit value detectable by second AD converter 82 to 7.0 V, for example, even when the individual battery voltage is in the overcharge region, i.e., 4.0 V or more.

[3-3. Advantageous Effects]

Battery system 3 described above can achieve the same advantageous effects as those of battery system 1 according to Embodiment 1.

Embodiment 4

The battery system according to Embodiment 4 as one aspect of the present disclosure will now be described, in which part of the configuration of battery system 1 according to Embodiment 1 is modified.

In the example of battery system 1 according to Embodiment 1, voltage detection circuit 50 executes the first abnormality detection processing. In contrast, in the battery system according to Embodiment 4, the voltage detection circuit executes the fourth abnormality detection processing, which is a partial modification of the first abnormality detection processing.

Mainly the differences between the battery system and battery system 1 according to Embodiment 1 will now be described in detail with reference to the drawings.

[4-1. Configuration]

Figure 11:
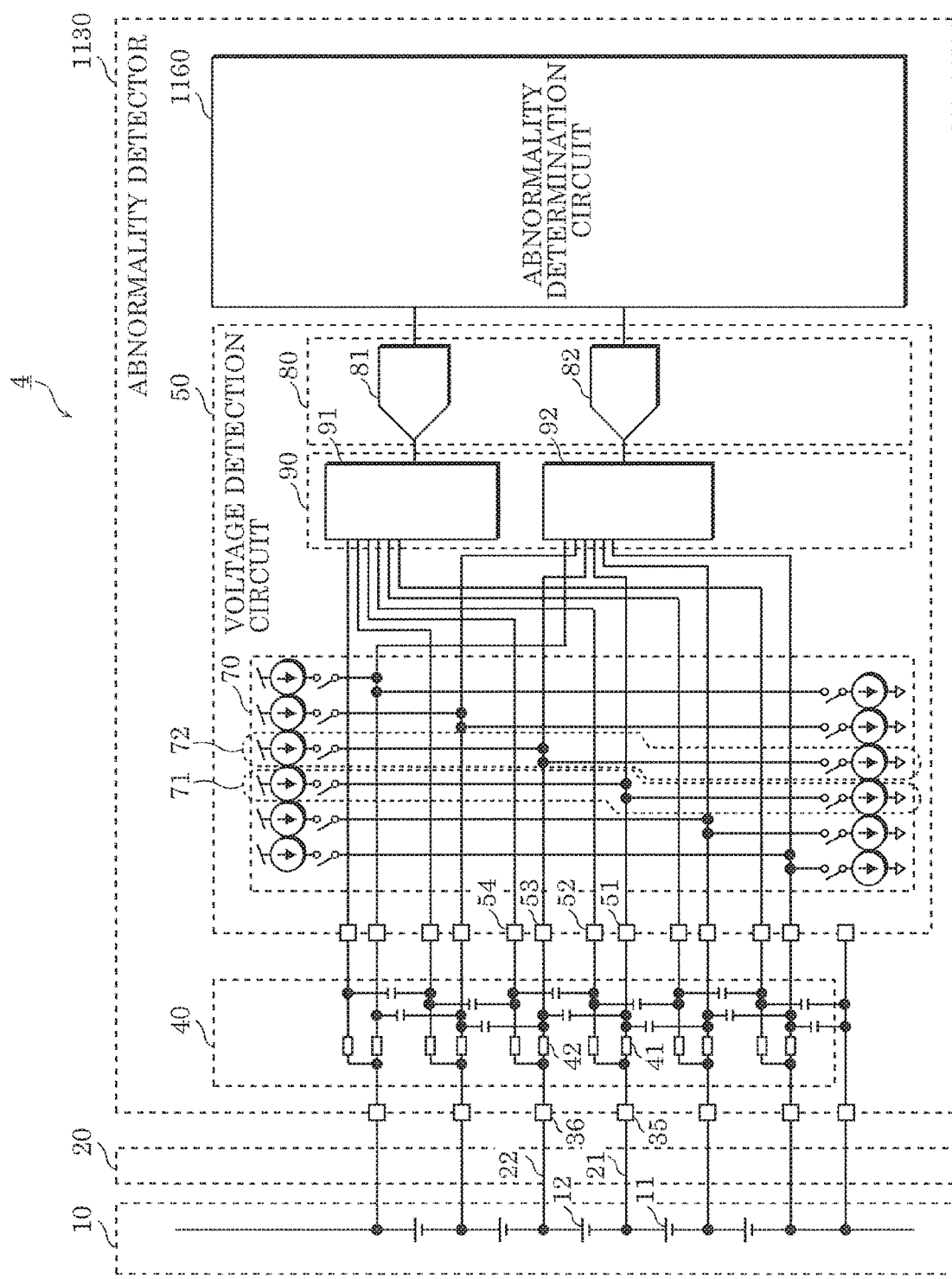
FIG. 11 is a block diagram illustrating a configuration of a battery system according to Embodiment 4.

FIG. 11 is a block diagram illustrating a configuration of battery system 4 according to Embodiment 4.

Battery system 4 has the hardware as that in battery system 1 according to Embodiment 1. In contrast, the software to be executed by battery system 4 is a partial modification of the software to be executed by battery system 1 according to Embodiment 1. Because of this partial modification, abnormality determination circuit 60 in battery system 1 according to Embodiment 1 is replaced with abnormality determination circuit 1160 in battery system 4. Accompanied by this modification, abnormality detector 30 corresponding to the outer box of abnormality determination circuit 60 in Embodiment 1 is replaced with abnormality detector 1130.

Similarly to abnormality determination circuit 60 in Embodiment 1, based on the difference in potential detected by voltage detection circuit 50, abnormality determination circuit 1160 detects the connection abnormality of each of the voltage detection lines (including first voltage detection line 21) included in voltage detection line group 20. Unlike abnormality determination circuit 60 in Embodiment 1 which detects the connection abnormality through execution of the first abnormality detection processing, abnormality determination circuit 1160 detects the connection abnormality through execution of the fifth abnormality detection processing, which is a partial modification of the first abnormality detection processing.

Alternatively, voltage detector 80 may only convert the terminal voltages into digital values, and abnormality determination circuit 1160 may detect the difference in potential and the connection abnormality of each of the voltage detection lines. In other words, voltage detector 80 may detect only the terminal voltages, and abnormality determination circuit 1160 may detect the difference in potential and the connection abnormality of each of the voltage detection lines.

The operation of battery system 4 having the above configuration will now be described with reference to the drawings.

[4-2. Operation]

Figure 12:
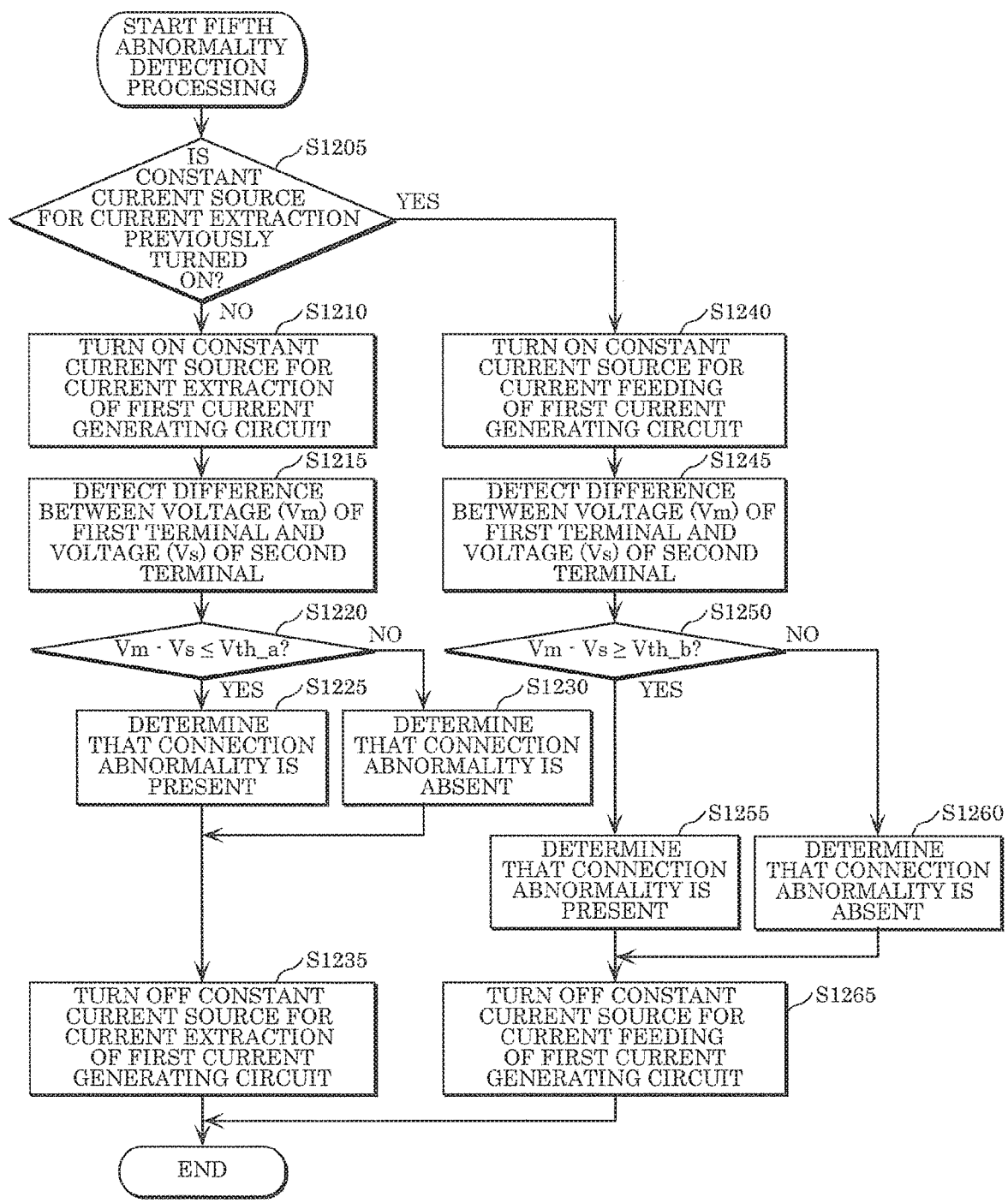
FIG. 12 is a flowchart illustrating fifth abnormality detection processing.

FIG. 12 is a flowchart illustrating the fifth abnormality detection processing.

In FIG. 12, the processings in Steps S1210 to S1265 correspond to the processings in Steps S10 to S65 of the first abnormality detection processing in Embodiment 1, where "abnormality determination circuit 60" is replaced with "abnormality determination circuit 1160". Accordingly, these processings have been already described above, and the duplication of the description will be omitted. The processing in Step S1205 will be mainly described.

When the fifth abnormality detection processing is started, abnormality determination circuit 1160 determines whether the constant current source for current extraction of first current generating circuit 71 connected to first voltage detection line 21 is turned on in the fifth abnormality detection processing previously performed on first voltage detection line 21 (target voltage detection line for detection of connection abnormality), that is, whether the processing goes to the processing in Step S1210 in the fifth abnormality detection processing previously performed on first voltage detection line 21 (Step S1205). Here, for example, when the fifth abnormality detection processing is not performed on first voltage detection line 21 in the past, it may be determined that the constant current source for current extraction of first current generating circuit 71 connected to first voltage detection line 21 is turned on in the fifth abnormality detection processing previously executed.

When it is determined that the constant current source for current extraction of first current generating circuit 71 is turned on in the processing in Step S1205, that is, it is determined that the processing goes to the processing in Step S1210 in the fifth abnormality detection processing previously performed on first voltage detection line 21 (Step S1205: Yes), the processing goes to the processing in Step S1240.

When it is determined that the constant current source for current extraction of first current generating circuit 71 is not turned on in the processing in Step S1205, that is, it is determined that the processing goes to the processing in Step S1240 rather than the processing in Step S1210 in the fifth abnormality detection processing previously performed on first voltage detection line 21 (Step S1205: No), the processing goes to the processing in Step S1210.

[4-3. Advantageous Effects]

Battery system 4 described above can achieve the same advantageous effects as those of battery system 1 according to Embodiment 1 as well as the following advantageous effect.

In other words, when the fifth abnormality detection processing is repeatedly executed, battery system 4 alternately executes the feed and extraction of current into and from the individual batteries included in assembled battery 10. For this reason, even when the connection abnormality of each of the voltage detection lines is repeatedly examined, battery system 4 can avoid situations where the current is only fed into or extracted from the individual batteries included in assembled battery 10.

Embodiment 5

The battery system according to Embodiment 5 as one aspect of the present disclosure will now be described, in which part of the configuration of battery system 1 according to Embodiment 1 is modified.

Battery system 1 according to one example of Embodiment 1 includes current generating circuit group 70 including the current generating circuits, each of the current generating circuits including a constant current source for current feeding and a constant current source for current extraction. In contrast, in an example of the battery system according to Embodiment 5, the current generating circuits included in the current generating circuit group each include a switch for short-circuiting the individual batteries included in assembled battery 10 in the sub-monitoring system.

Mainly the differences between the battery system and battery system 1 according to Embodiment 1 will now be described in detail with reference to the drawings.

[5-1. Configuration]

Figure 13:
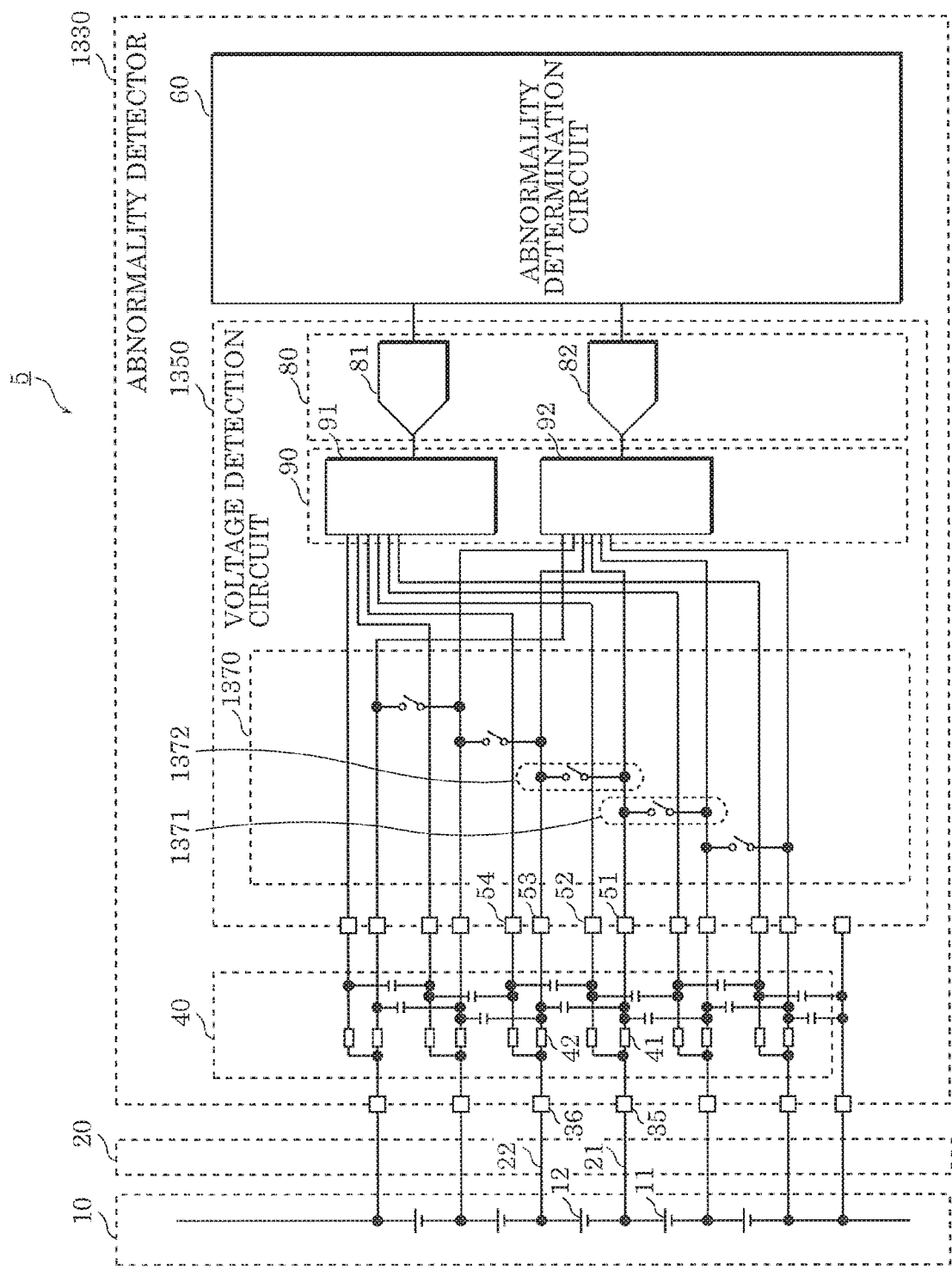
FIG. 13 is a block diagram illustrating a configuration of a battery system according to Embodiment 5.

FIG. 13 is a block diagram illustrating a configuration of battery system 5 according to Embodiment 5.

Battery system 5 is a modification of battery system 1 according to Embodiment 1 where current generating circuit group 70 in Embodiment 1 is replaced with current generating circuit group 1370. Accompanied by this modification, voltage detection circuit 50 and abnormality detector 30 corresponding to the outer boxes of current generating circuit group 70 in Embodiment 1 are replaced with voltage detection circuit 1350 and abnormality detector 1330, respectively.

Current generating circuit group 1370 includes a plurality of current generating circuits in the sub-monitoring system, each of the current generating circuits including a switch for short-circuiting the cathodes and the anodes of the individual batteries included in assembled battery 10. These current generating circuits include first current generating circuit 1371 and second current generating circuit 1372.

First current generating circuit 1371 includes a switch for short-circuiting the cathode and anode of first individual battery 11 through first resistor 41 in the sub-monitoring system.

Second current generating circuit 1372 includes a switch for short-circuiting the cathode and anode of second individual battery 12 through second resistor 42 in the sub-monitoring system.

The switch forming each of the current generating circuits including first current generating circuit 1371 and second current generating circuit 1372 is implemented by a metal oxide semiconductor field effect transistor (MOSFET), for example.

These switches may also serve as cell balancing switches used in cell balancing of the individual batteries included in assembled battery 10. In cell balancing, individual batteries which need discharge are selected according to the residual capacity. The cell balancing switches corresponding to the selected individual batteries are turned on to discharge the individual batteries, performing the cell balancing of the residual capacities of the individual batteries.

The current generating circuits each may include not only the switch but also a resistor connected in series to the switch.

The operation of battery system 1 having the above configuration will now be described.

[5-2. Operation]

When the switch of first current generating circuit 1371 is turned on, the short-circuit current flows from the cathode of first individual battery 11 to the anode thereof. For this reason, first current generating circuit 1371 functions as a current source which extracts current from first terminal 51.

When the switch of second current generating circuit 1372 is turned on, the short-circuit current flows from the cathode of second individual battery 12 to the anode thereof. For this reason, second current generating circuit 1372 functions as a current source which feeds current into first terminal 51 and as a current source which extracts current from third terminal 53.

In other words, the current generating circuits included in current generating circuit group 1370 function as a current source similar to the current generating circuits included in current generating circuit group 70 in Embodiment 1.

Accordingly, battery system 5 according to Embodiment 5 can detect the connection abnormality of each of the voltage detection lines included in voltage detection line group 20 by the same procedure as that of battery system 1 according to Embodiment 1.

[5-3. Advantageous Effects]

Battery system 5 described above can achieve the same advantageous effects as those of battery system 1 according to Embodiment 1.

Embodiment 6

The battery system according to Embodiment 6 as one aspect of the present disclosure will now be described, in which part of the configuration of battery system 2 according to Embodiment 2 is modified.

Battery system 2 according to one example of Embodiment 2 includes voltage detector 80 including first AD converter 81 and second AD converter 82. In contrast, in an example of battery system according to Embodiment 6, the voltage detector includes a comparator rather than the AD converter.

Mainly the difference between the battery system and battery system 2 according to Embodiment 2 will now be described in detail with reference to the drawings.

[6-1. Configuration]

Figure 14:
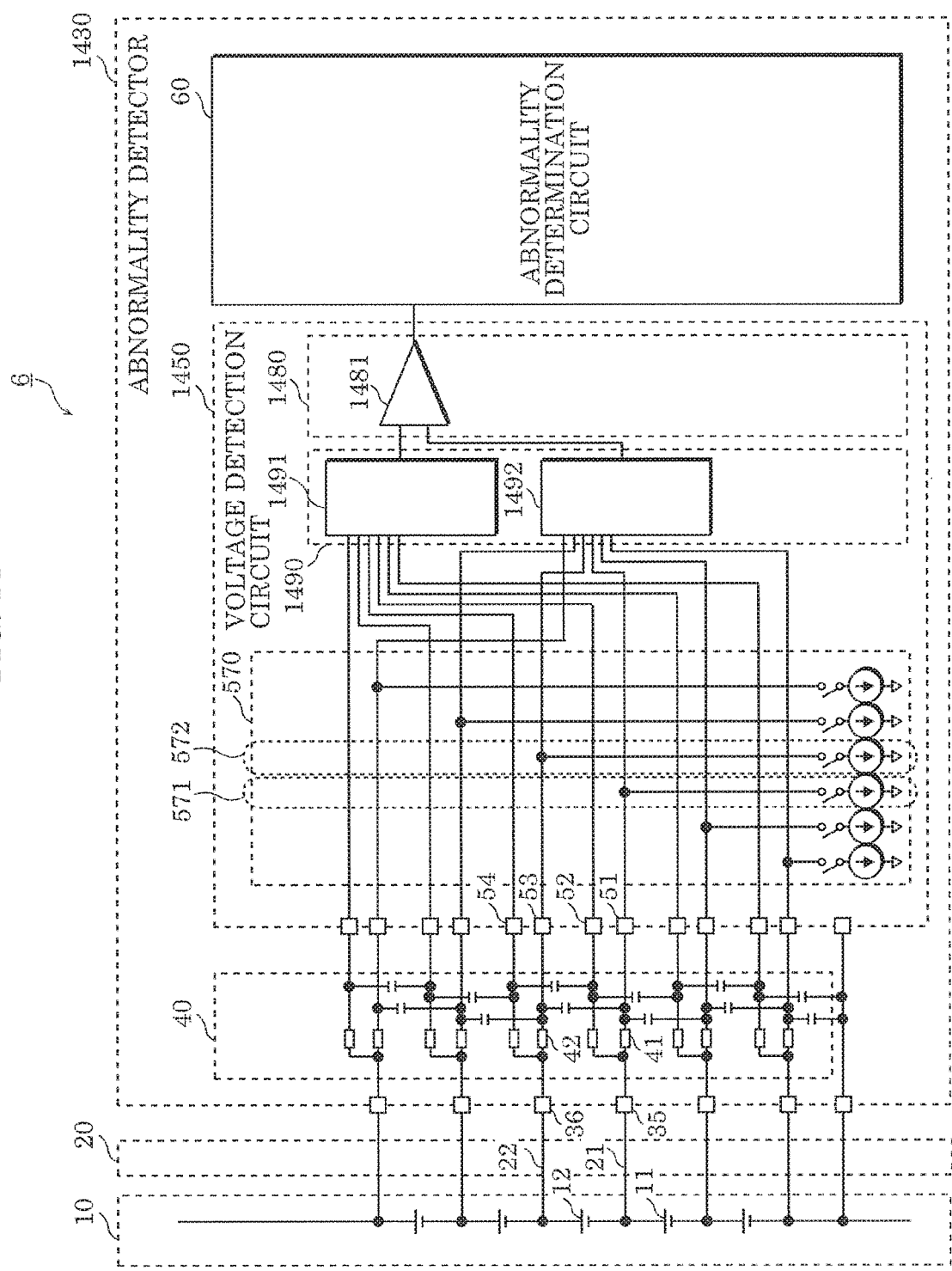
FIG. 14 is a block diagram illustrating a configuration of a battery system according to Embodiment 6.

FIG. 14 is a block diagram illustrating a configuration of battery system 6 according to Embodiment 6.

Battery system 6 is a modification of battery system 2 according to Embodiment 2 where voltage detector 80 and multiplexer 90 in Embodiment 2 are replaced with voltage detector 1480 and multiplexer 1490, respectively. Accompanied by this modification, voltage detection circuit 550 and abnormality detector 530 corresponding to the outer boxes of voltage detector 80 and multiplexer 90 in Embodiment 2 are replaced with voltage detection circuit 1450 and abnormality detector 1430, respectively.

Multiplexer 1490 includes first multiplexer 1491 and second multiplexer 1492. Multiplexer 1490 selectively transmits one of the pairs of voltages to voltage detector 1480, the pairs of voltages being a pair of the voltage of first terminal 51 and the voltage of second terminal 52 and a pair of the voltage of third terminal 53 and the voltage of fourth terminal 54.

Here, the voltage of the terminal refers to the voltage of the target terminal where the ground potential is used as a reference. The term "transmit the voltage of the target terminal to voltage detector 1480" means that the potential of the target terminal is transmitted to voltage detector 1480.

Thus, voltage detection circuit 1450 has two systems which monitor the voltages of the individual batteries included in assembled battery 10, that is, a main monitoring system including first multiplexer 1491 and a sub-monitoring system including second multiplexer 1492.

Voltage detector 1480 includes comparator 1481. Voltage detector 1480 detects the difference between the two voltages selected by multiplexer 1490.

Comparator 1481 detects the difference between the voltage selectively transmitted by first multiplexer 1491 and the voltage selectively transmitted by second multiplexer 1492. In other words, when first multiplexer 1491 selectively transmits the voltage of first terminal 51 and second multiplexer 1492 selectively transmits the voltage of second terminal 52, voltage detector 1480 detects the difference between the voltage of first terminal 51 and the voltage of second terminal 52.

Comparator 1481 can set off-setting value Vth. In other words, in the case where off-setting value Vth is set, comparator 1481 outputs a logical value "1" when the first voltage and the second voltage to be compared are equal to or higher than off-setting value Vth, and outputs a logical value "0" when the first voltage and the second voltage to be compared are less than off-setting value Vth.

An example of comparator 1481 can be implemented by an analog comparator.

The operation of battery system 6 having the above configuration will now be described with reference to the drawings.

[6-2. Operation]

As its characteristic operation, battery system 6 executes sixth abnormality detection processing.

The sixth abnormality detection processing is mainly executed by voltage detection circuit 1450 to detect the connection abnormality of each of the voltage detection lines included in voltage detection line group 20. Although any one of the voltage detection lines included in voltage detection line group 20 can be a target voltage detection line for the sixth abnormality detection processing, among these voltage detection lines, first voltage detection line 21 is used as a representative example of the target for the detection of connection abnormality in the following description.

The connection abnormality can be detected for all of the voltage detection lines included in voltage detection line group 20 by sequentially performing the sixth abnormality detection processing on the voltage detection lines included in voltage detection line group 20, for example.

Figure 15:
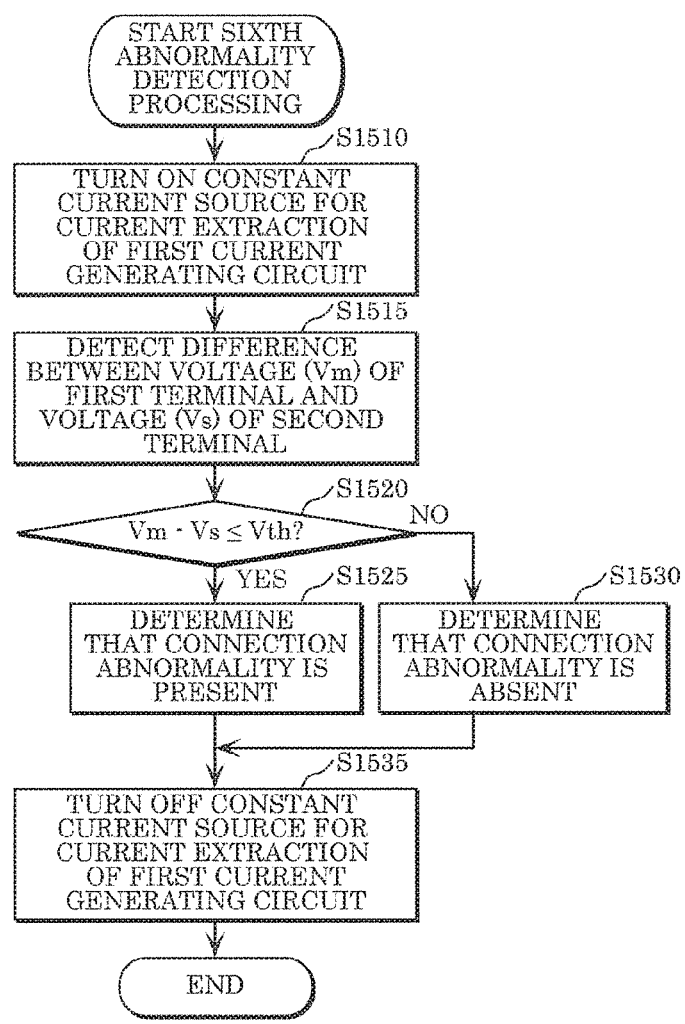
FIG. 15 is a flowchart illustrating sixth abnormality detection processing.

FIG. 15 is a flowchart illustrating the sixth abnormality detection processing.

The sixth abnormality detection processing is started when a predetermined condition is satisfied (for example, when a predetermined time has passed since voltage detection circuit 1450 was activated, a predetermined time has passed since the last sixth abnormality detection processing was executed, or when a user of voltage detection circuit 1450 performs a predetermined operation on voltage detection circuit 1450).

When sixth abnormality detection processing is started, abnormality determination circuit 60 turns on the constant current source for current extraction of first current generating circuit 71, which is connected to first voltage detection line 21 as the target for the detection of connection abnormality (Step S1510).

Abnormality determination circuit 60 then controls the selection between first multiplexer 1491 and second multiplexer 1492, and causes multiplexer 1490 to select the pair of the voltage of first terminal 51 and the voltage of second terminal 52. Abnormality determination circuit 60 then controls comparator 1481, and causes voltage detector 1480 to detect the difference between the voltage of second terminal 52 (voltage Vm detected in the main monitoring system) and the voltage of first terminal 51 (voltage Vs detected in the sub-monitoring system) (Step S1515).

When difference (Vm−Vs) between voltage Vm of second terminal 52 and voltage Vs of first terminal 51 is detected, abnormality determination circuit 60 determines whether the value of difference (Vm−Vs) is equal to or less than a predetermined abnormality determination value (threshold) Vth (for example, 0.5 V) (Step S1520).

When the value of difference (Vm−Vs) is equal to or less than Vth in the processing in Step S1520 (Step S1520: Yes), abnormality determination circuit 60 determines that first voltage detection line 21 has connection abnormality (Step S1525).

When the value of difference (Vm−Vs) is higher than Vth in the processing in Step S1520 (Step S1520: No), abnormality determination circuit 60 determines that first voltage detection line 21 has no connection abnormality (Step S1530).

When the processing in Step S1525 or S1530 is completed, abnormality determination circuit 60 turns off the constant current source for current extraction of first current generating circuit 71 (Step S1535).

When the processing in Step S1535 is completed, voltage detection circuit 1450 terminates the sixth abnormality detection processing.

With reference to the drawings, the determination of the presence/absence of connection abnormality by abnormality determination circuit 60 in the processings from Step S1510: No to Step S1535 will now be described in more detail.

Figure 16A:
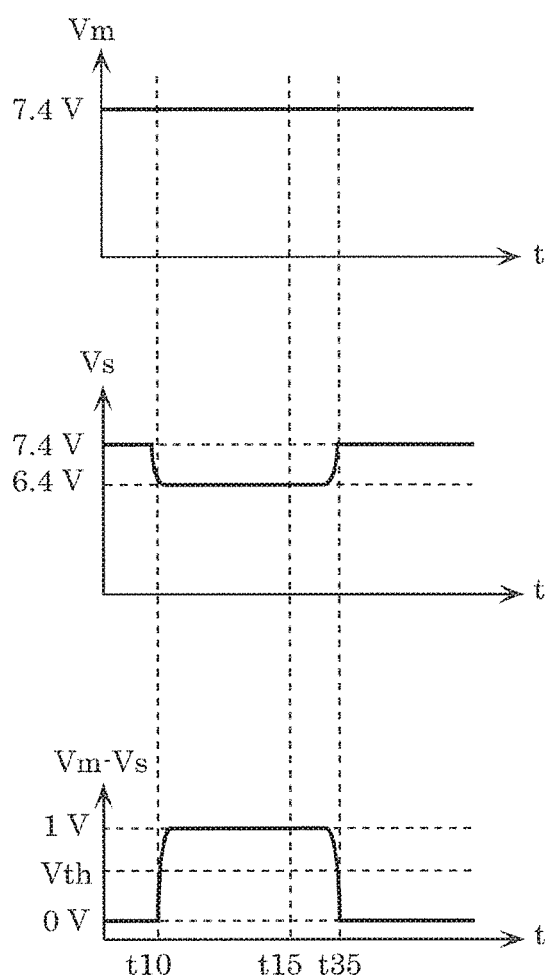
FIG. 16A is a schematic pattern diagram illustrating a transition of the voltage in the sixth abnormality detection processing.

FIG. 16A is a schematic view illustrating a transition of voltage Vm detected in the main monitoring system, a transition of voltage Vs detected in the sub-monitoring system, and a transition of difference (Vm−Vs) when first voltage detection line 21 has no connection abnormality caused by disconnection.

Figure 16B:
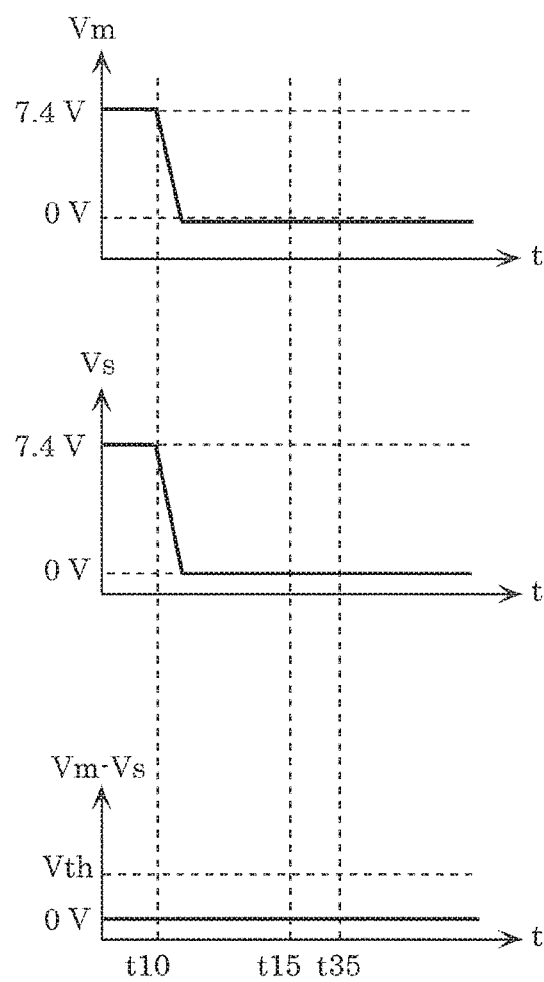
FIG. 16B is another schematic pattern diagram illustrating a transition of the voltage in the sixth abnormality detection processing.

FIG. 16B is a schematic view illustrating a transition of voltage Vm detected in the main monitoring system, a transition of voltage Vs detected in the sub-monitoring system, and a transition of difference (Vm−Vs) when first voltage detection line 21 has connection abnormality caused by disconnection.

(a) When first voltage detection line 21 has no connection abnormality caused by disconnection (see FIG. 16A), voltage Vm detected in the main monitoring system remains 7.4 V (potential of the cathode of first individual battery 11) even when the constant current source for current extraction of first current generating circuit 571 is turned on at time t10. In contrast, when the constant current source for current extraction of first current generating circuit 571 is turned on at time t10, voltage Vs detected in the sub-monitoring system decreases from the potential (7.4 V) of the cathode of individual battery 11 to 6.4 V, which is obtained by subtraction of the voltage (1 V (=1 KΩ×1 mA)) generated as a result of the constant current (1 mA) flowing into first resistor 41 (1 KΩ). For this reason, difference (Vm−Vs) detected at time t15 is 1 V.

In contrast, (b) when first voltage detection line 21 has connection abnormality caused by disconnection (see FIG. 16B) and the constant current source for current extraction of first current generating circuit 571 is turned on at time t10, first terminal 51 is in a high impedance state without being connected to the cathode of first individual battery 11. For this reason, the voltage of first terminal 51 decreases (for example, 0 V in this case) to an extent that the current is no longer extracted by the constant current source for current extraction of first current generating circuit 571. For this reason, voltage Vs detected in the sub-monitoring system also reduces to 0 V. Similarly, second terminal 52 is in a high impedance state without being connected to the cathode of first individual battery 11, and the voltage of second terminal 52 decreases (for example, 0 V in this case) to an extent that the current is no longer extracted by the constant current source for current extraction of first current generating circuit 571. For this reason, voltage Vs detected by the main monitoring system also decreases to 0 V. For this reason, difference (Vm−Vs) detected at time t15 is 0 V.

Accordingly, the presence/absence of the connection abnormality caused by disconnection can be detected by setting abnormality determination value Vth at 0.5 V, for example.

Because the value of difference (Vm−Vs) varies according to the constant of filter circuit and the current value of the constant current source, abnormality determination value Vth may also be set such that these conditions are satisfied.

[6-3. Advantageous Effects]

Battery system 6 described above can achieve the same advantageous effects as those of battery system 1 according to Embodiment 1.

(Supplementary Description)

Embodiments 1 to 6 have been described as examples of the technique disclosed in the present disclosure. However, the technique according to this disclosure can be applied to not only Embodiments 1 to 6 but also embodiments on which modification, change, substitution, addition, or elimination is performed.

(1) According to the descriptions in Embodiments 1 to 5, the main monitoring system is composed of a single multiplexer and a single AD converter (for example, first multiplexer 91 and first AD converter 81 in Embodiment 1), and the sub-monitoring system is composed of a single multiplexer and a single AD converter (for example, second multiplexer 92 and second AD converter 82 in Embodiment 1).

Figure 17A:
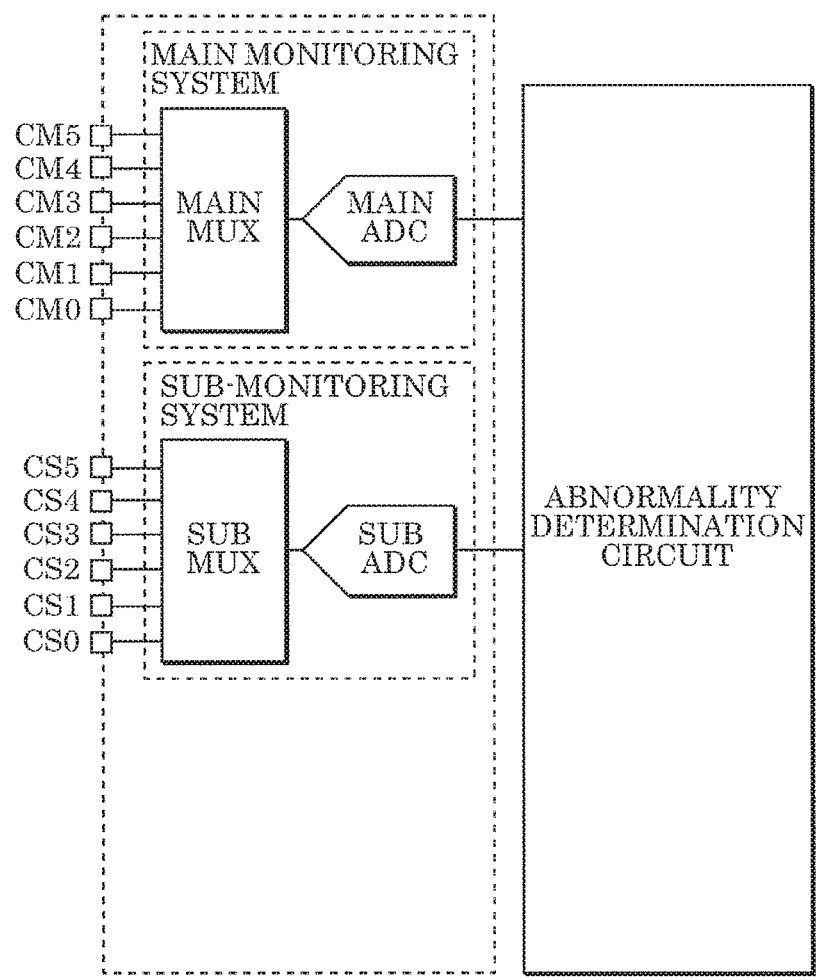
FIG. 17A is schematic view 1 illustrating one example of a main monitoring system and a sub-monitoring system.

FIG. 17A is a block diagram illustrating an example of a configuration in which the main monitoring system is composed of a single multiplexer and a single AD converter and the sub-monitoring system is composed of a single multiplexer and a single AD converter.

Figure 17B:
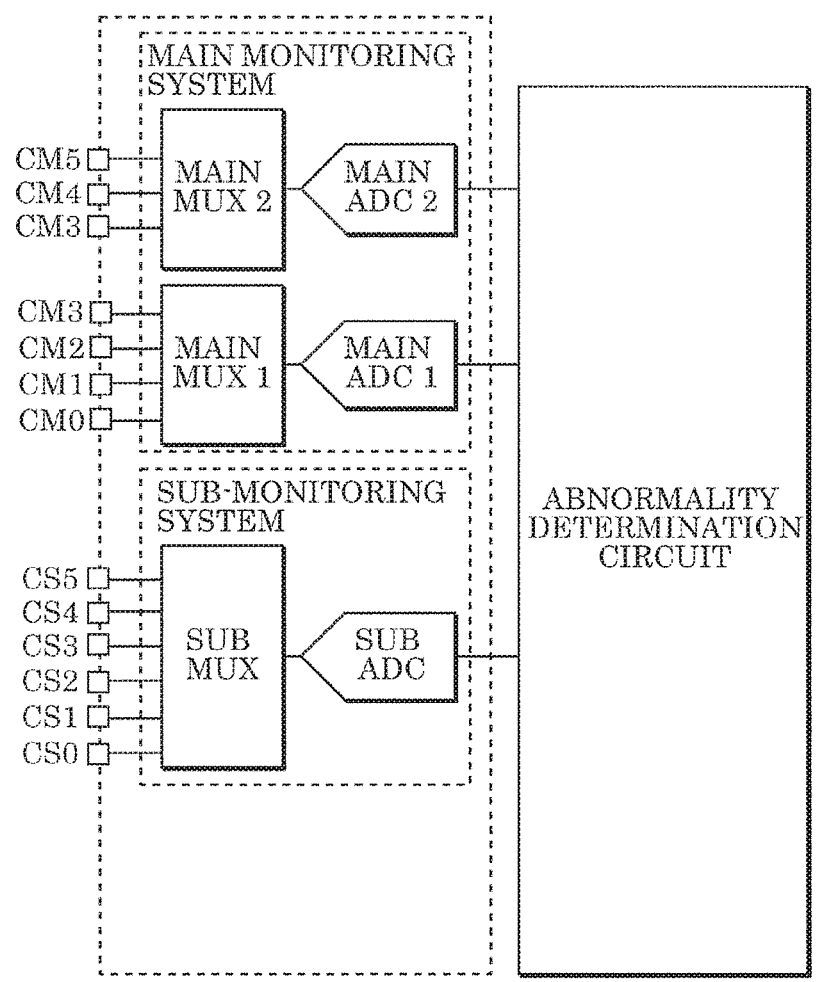
FIG. 17B is schematic view 2 illustrating one example of the main monitoring system and the sub-monitoring system.
Figure 17C:
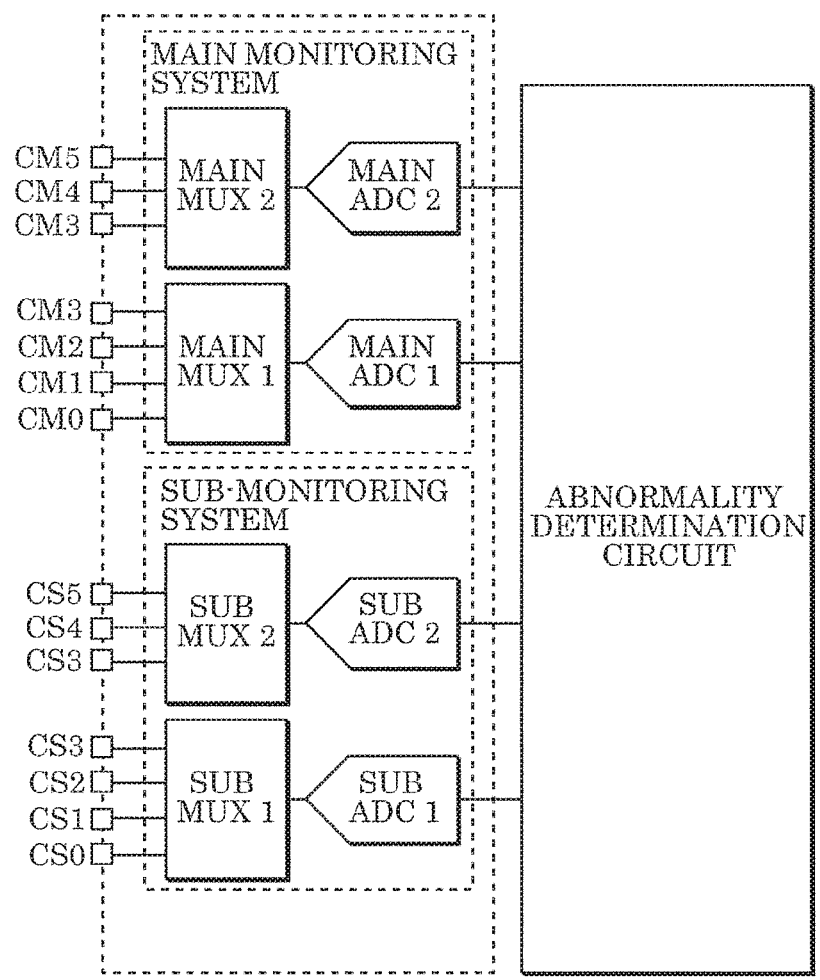
FIG. 17C is schematic view 3 illustrating one example of the main monitoring system and the sub-monitoring system.

However, the number of the multiplexer and that of the AD converter included in the main monitoring system and the sub-monitoring system are not always limited to one. For example, as illustrated in FIG. 17B, the main monitoring system may include a plurality of multiplexers and a plurality of AD converters, or as illustrated in FIG. 17C, the main monitoring system and the sub-monitoring system each may include a plurality of multiplexers and a plurality of AD converters. The number of voltages to be measured by the main monitoring system does not always need to be identical to the number of voltages to be measured by the sub-monitoring system. Furthermore, the main monitoring system and the sub-monitoring system each may include AD converters for the target voltages without any multiplexer.

(2) According to the description of Embodiment 6, the main monitoring system is composed of a single multiplexer (first multiplexer 1491), the sub-monitoring system is composed of a single multiplexer (second multiplexer 1492), and the voltage detector is composed of a single comparator (comparator 1481).

Figure 18A:
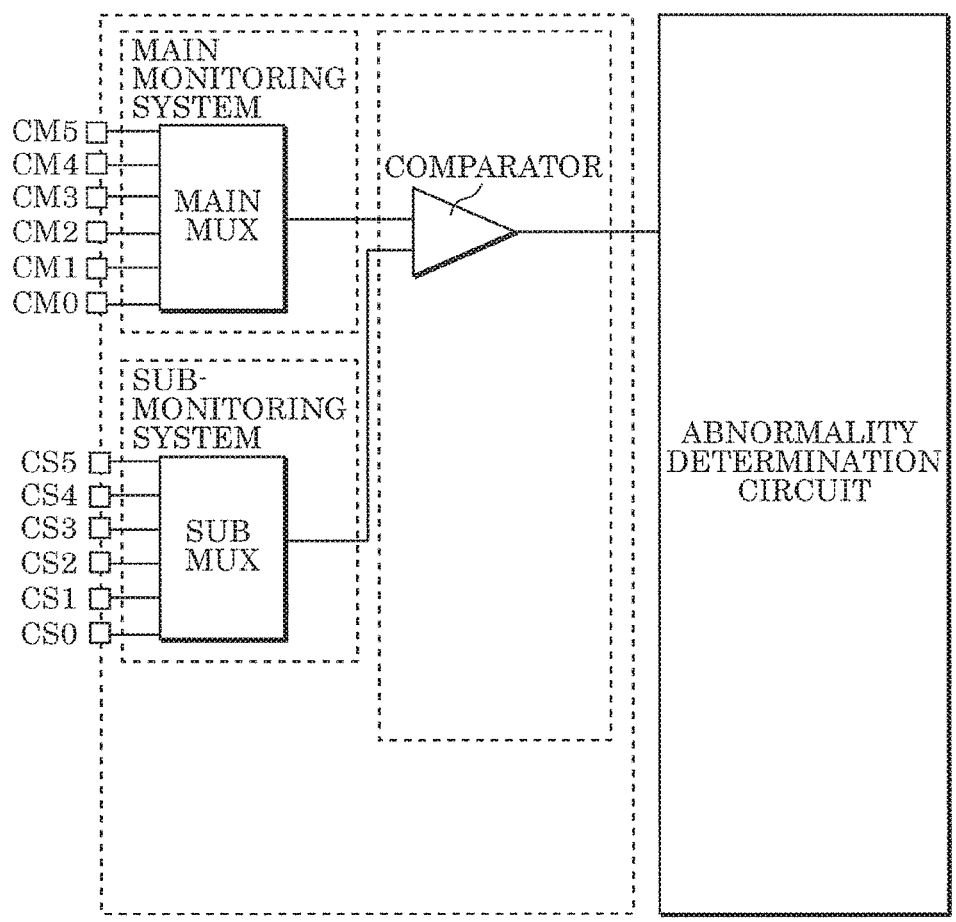
FIG. 18A is schematic view 4 illustrating one example of the main monitoring system and the sub-monitoring system.

FIG. 18A is a block diagram illustrating an example in which the main monitoring system is composed of a single multiplexer, a sub-monitoring system is composed of a single multiplexer, and a voltage detector is composed of a single comparator.

Figure 18B:
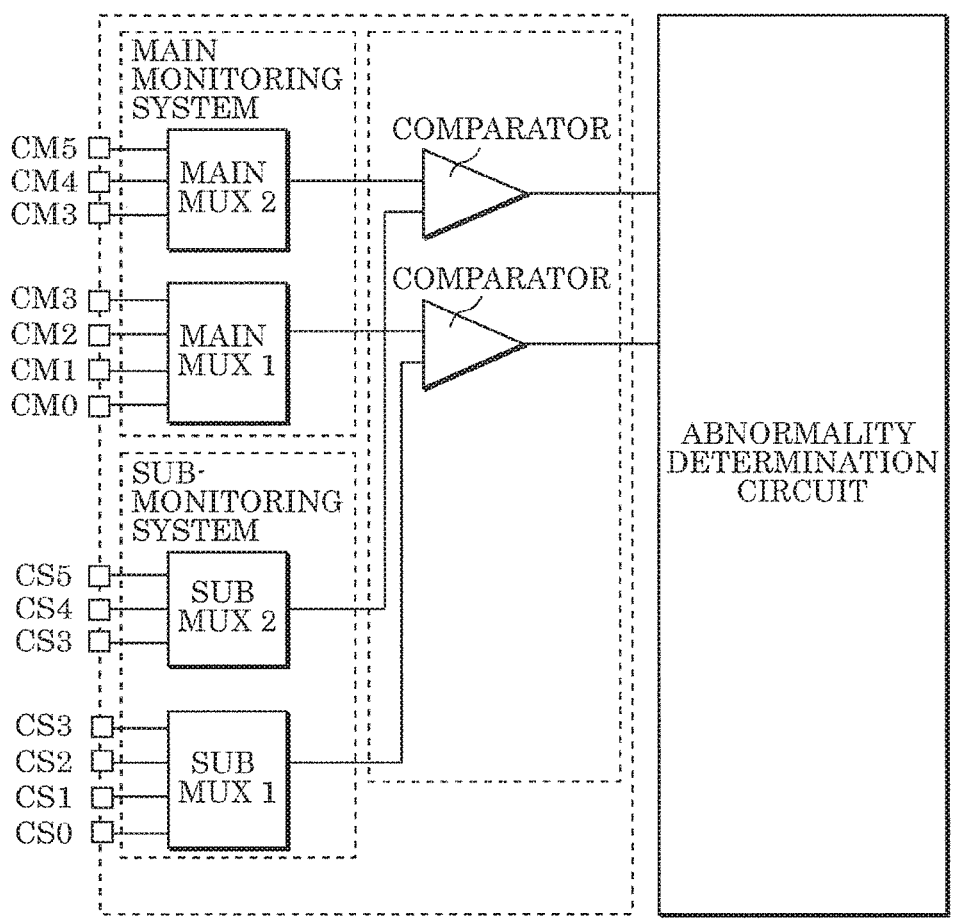
FIG. 18B is schematic view 5 illustrating one example of the main monitoring system and the sub-monitoring system.
Figure 18C:
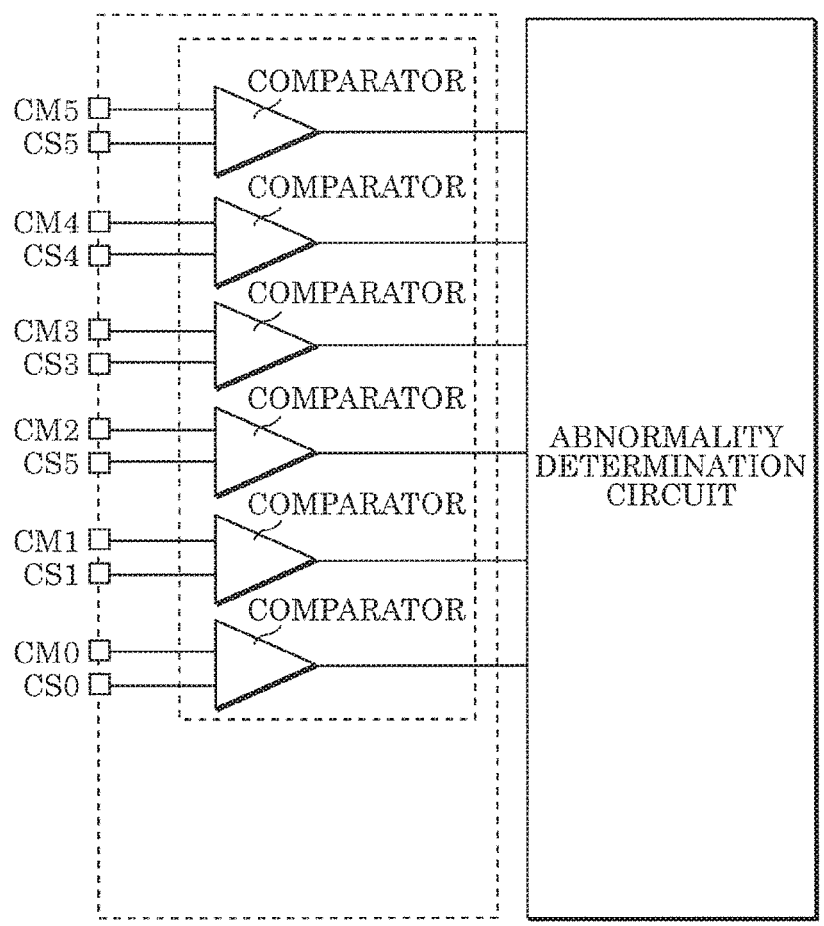
FIG. 18C is schematic view 6 illustrating one example of the main monitoring system and the sub-monitoring system.

However, the main monitoring system and the sub-monitoring system may include any number of multiplexers, and the voltage detector may include any number of comparators. For example, as an example illustrated in FIG. 18B, the main monitoring system and the sub-monitoring system each may be composed of a plurality of multiplexers, and the voltage detector may be composed of a plurality of comparators. Also as another example illustrated in FIG. 18C, the main monitoring system and the sub-monitoring system do not include any multiplexer, and comparators may be disposed between pairs of terminals to be compared.

(3) According to the descriptions of Embodiments 1 to 6, the abnormality detector includes a single filter circuit, a single voltage detection circuit, and a single abnormality determination circuit.

However, the abnormality detector can have any configuration other than that described above.

Figure 19:
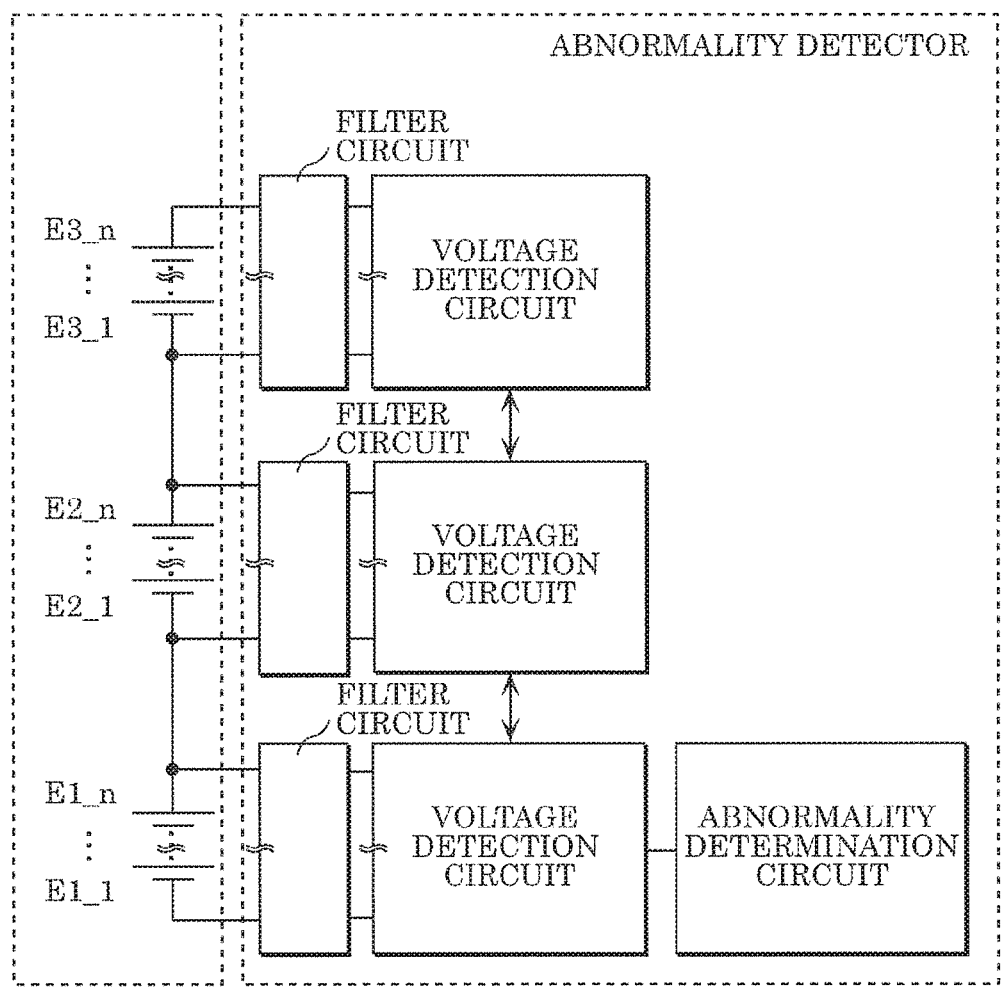
FIG. 19 is a schematic view illustrating one example of an abnormality detector.

FIG. 19 is a block diagram illustrating an example in which the abnormality detector includes several units (such as individual battery monitoring ICs) for individual batteries, each of the unit including a set of a filter circuit and a voltage detection circuit.

As one example, the abnormality detector can have a configuration illustrated in FIG. 19. In this case, for example, the units may be communicably connected to each other. The abnormality determination circuit may be communicably connected to one of the units, and may communicate with the remaining units by a daisy chain method.

(4) Furthermore, the following embodiment can also be considered.

4-1. Embodiment 7

The energy storage module management system according to the present embodiment includes an assembled battery including cells connected to each other in series. The energy storage module management system includes detection terminals connected to both terminals of the cell, an abnormality detection circuit which detects the abnormality of a cell voltage, and a current input/output unit into or from the cell through a connection line. The abnormality detection circuit includes two systems which monitor the voltage of one cell (referred to as main monitoring system and sub-monitoring system). The disconnection is detected through comparison between the voltage values in the main monitoring system and in the sub-monitoring system in the state where current is drawn from or fed into the one cell by the current input/output unit.

Figure 20A:
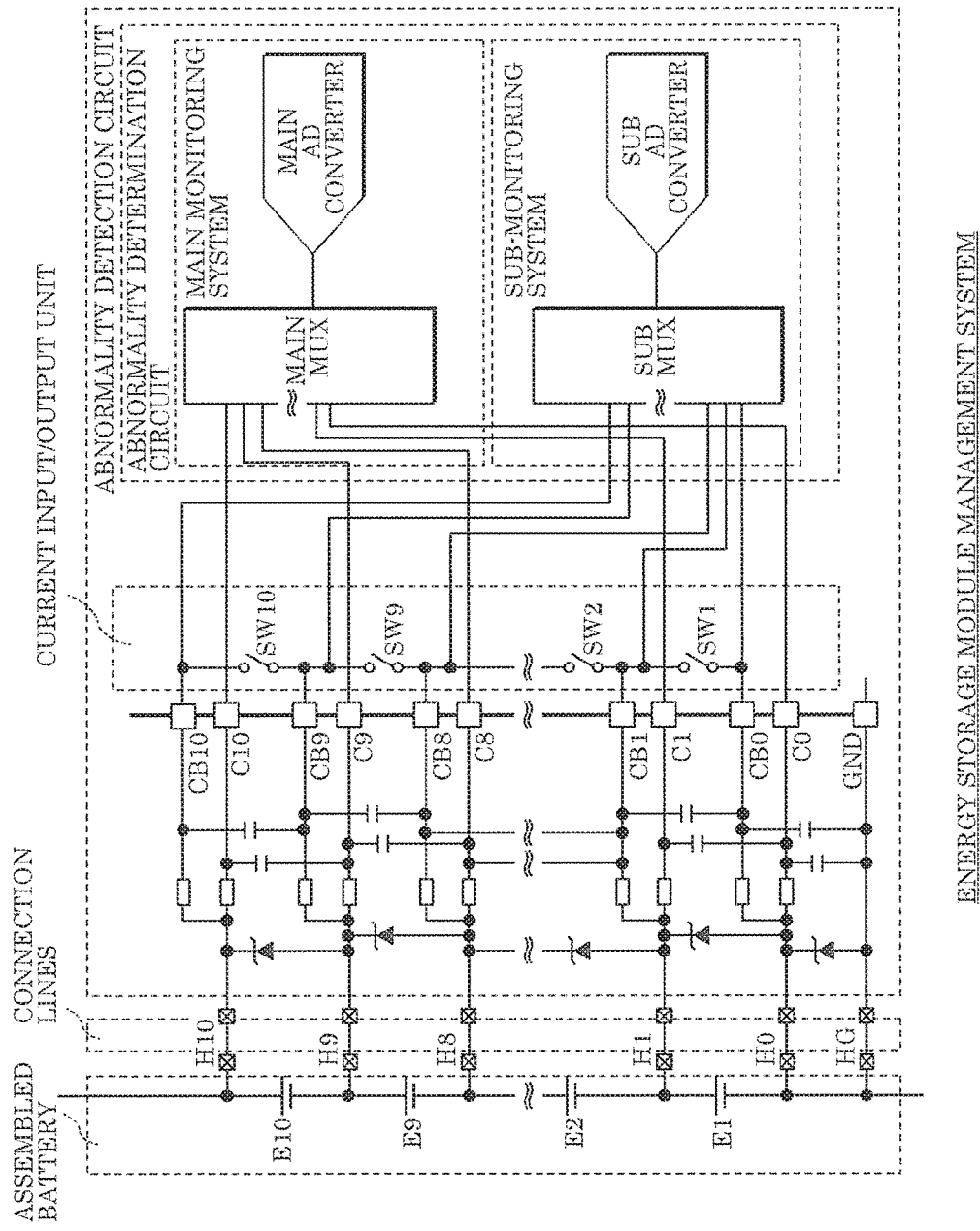
FIG. 20A is a block diagram illustrating an energy storage module management system according to Embodiment 7.
Figure 20B:
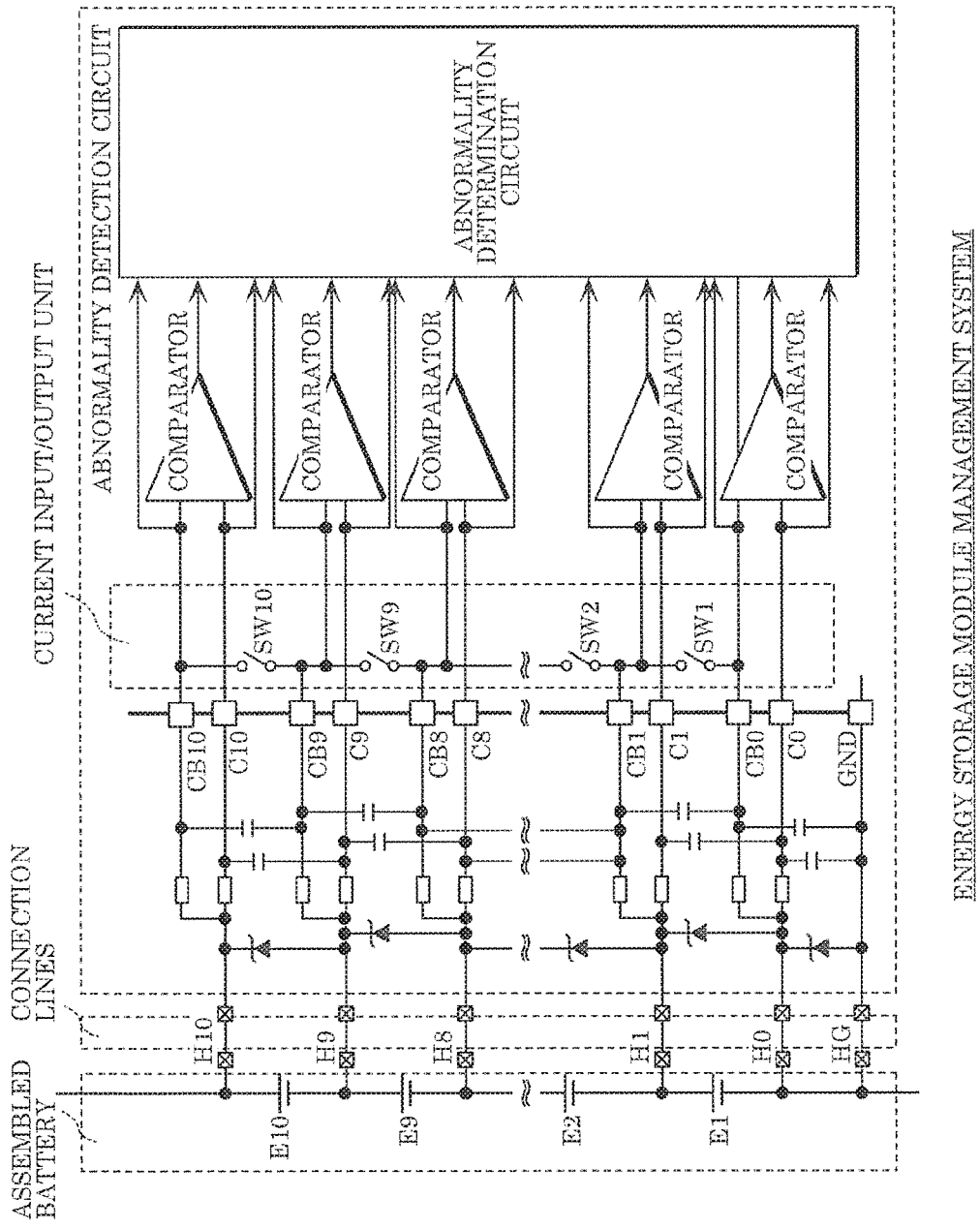
FIG. 20B is another block diagram illustrating the energy storage module management system according to Embodiment 7.
Figure 20C:
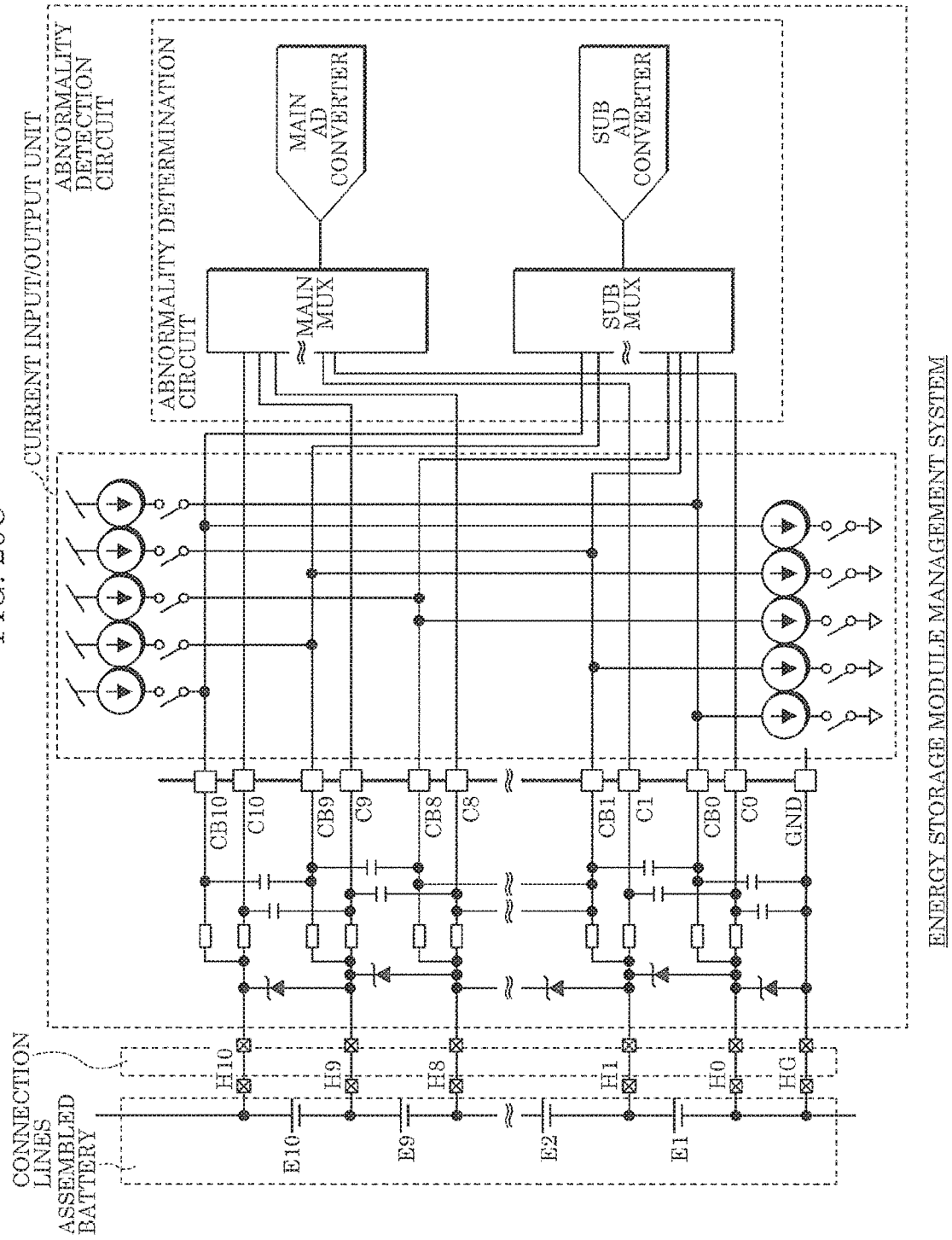
FIG. 20C is another block diagram illustrating the energy storage module management system according to Embodiment 7.

FIGS. 20A, 20B, and 20C are diagrams illustrating the configurations of energy storage module management systems according to Embodiment 7. In FIGS. 20A, 20B, and 20C, a system which determines abnormality using C0 to C10 is the main monitoring system, and the system which determines abnormality using CB0 to CB10 is the sub-monitoring system.

The following current input/output unit to or from the cell can be considered.

(1-1) A circuit which short-circuits between the detection terminals (FIGS. 20A and 20B).

(1-2) A circuit which short-circuits the detection terminals to any potential (any potential is, for example, GND potential or internally generated voltage).

In the circuits (1-1) and (1-2), the detection terminals may be short-circuited with a resistor element interposed therebetween, rather than completely short-circuited. The short-circuiting may occur not only between adjacent detection terminals but also between any terminals. The circuit may be used in combination with a cell balancing circuit used for cell balancing of the cell voltage.

(1-3) A constant current circuit which draws or discharges the constant current (FIG. 20C).

(1-4) The circuits (1-1) to (1-3) may be implemented only in a specific cell or in several cells at the same time.

The following abnormality detection circuit can be considered.

(1-5) An AD converter which converts the cell voltage into a digital signal (FIG. 20A).

(1-6) A comparator which compares the cell voltage to a predetermined voltage (FIG. 20B).

The comparator or the AD converter can have the following configuration.

(1-7) The comparator or the AD converter is individually mounted on each of the cells.

(1-8) The comparator or the AD converter is shared with a unit of several cells, and the cell voltages sequentially selected by the multiplexer are input into the circuit.

[Other Points of Disclosure]

In the cell undergoing the detection of disconnection through input/output of the current and its adjacent cells, their input voltages to the abnormality detection circuit are changed from the original voltage. Accordingly, the abnormality of the cell voltage should be detected after a predetermined interval until the input/output of the current is stopped and the input voltage returns to the original value.

During the detection of the abnormality after the input/output of the current, such an interval can be ensured through the detection of the abnormality of a cell different from the cell subjected to input/output of the current.

For example, in the case where the detection of the voltage abnormality of an assembled battery including ten cells in total is performed with the comparator or AD converter having the configuration described in (1-8) (cell voltages are sequentially selected by the multiplexer), usually the cell voltages are measured in the order of cell E1→cell E2→ . . . cell E9→cell E10.

In the case where the detection of disconnection in cell E1 is performed, the subsequent detection of abnormality of the cell voltage can be performed in the order of cell E3→cell E4→ . . . cell E9→cell E10→cell E1→cell E2, thereby ensuring the interval until the voltage of cell E1 returns to the original value.

The measurement in the main monitoring system and the sub-monitoring system may be performed at the same timing (measurement in these systems at different timings obstructs accurate comparison in the case where the input voltage varies due to the time difference).

In the case where the constant current circuit is used as a current input/output unit to or from the cell, the currents consumed by the cells are unbalanced by only one of drawing and discharging of the current. Accordingly, drawing and discharging of the current are alternately performed to control the average current between the cell and the input terminal to be close to zero, equalizing currents consumed by the cells.

Figures 21A, 21B:
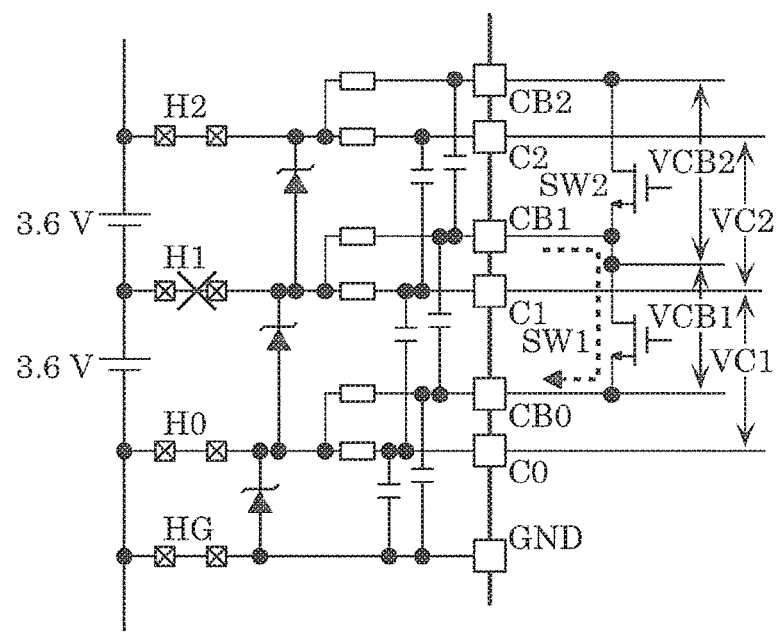
FIG. 21A is a circuit diagram of one example of a disconnection detector.
FIG. 21B is a table showing terminal voltages during non-disconnection and during disconnection.

The disconnection detector will be described with reference to FIGS. 21A and 21B.

The input terminal of the sub-monitoring system is connected through the connection line to a circuit which draws current from a cell or discharges current. A resistor element for filtering is disposed between the cell and the input terminal. When the current is drawn, a voltage changed from the original voltage of the cell is input to the sub-monitoring system.

When the voltage values in the main monitoring system and the sub-monitoring system in the state where the current flows are compared, a difference in voltage exceeding a predetermined value is generated between the main monitoring system and the sub-monitoring system during non-disconnection. During disconnection, the voltage in the main monitoring system is changed according to that in the sub-monitoring system, reducing the difference in potential compared to that during non-disconnection.

An example of sequences of detection of disconnection (when connection line H1 is disconnected) will be described.

(A) The cell voltages in the main monitoring system and the sub-monitoring system are measured.

(B) The short-circuiting switch of cell 1 is switched from OFF to ON.

(C) The cell voltages in the main monitoring system and the sub-monitoring system are measured.

(D) It is determined as disconnection when the difference in voltage between the main AD converter and the sub AD converter is 1.0 V or less.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure can be widely used in systems which detect the voltages of individual batteries.

What is claimed is:

1. A voltage detection circuit, comprising:
   a first terminal for connecting to one end of a first voltage detection line through a first resistor, the first voltage detection line having another end connected to a cathode or an anode of a first individual battery;
   a second terminal for connecting to the one end of the first voltage detection line without the first resistor;
   a first current generating circuit connected to the first terminal; and
   a voltage detector which detects a voltage of the first terminal and a voltage of the second terminal,
   wherein the voltage detector includes at least one first AD converter connected to the first terminal, and at least one second AD converter connected to the second terminal,
   the voltage detector substantially simultaneously performs (i) the detection of the voltage of the first terminal by the at least one first AD converter and (ii) the detection of the voltage of the second terminal by the at least one second AD converter,
   the voltage detector performs the detection of the voltage of the first terminal by the at least one first AD converter to detect a voltage of the first individual battery, when the first current generating circuit is ON, and
   the first current generating circuit includes a first constant current source which extracts current from the first terminal and a second constant current source which feeds current into the first terminal, and the first current generating circuit is connectable to the first voltage detection line via a switch which selectively switches between the first constant current source and the second constant current source.

2. The voltage detection circuit according to claim 1, wherein the voltage detector outputs a voltage of the first AD converter and a voltage of the second AD converter.

3. The voltage detection circuit according to claim 2, further comprising:
   a third terminal for connecting to one end of a second voltage detection line through a second resistor, the second voltage detection line having another end connected to a cathode or an anode of a second individual battery connected in series to the cathode of the first individual battery; and
   a fourth terminal for connecting to the one end of the second voltage detection line without the second resistor,
   wherein the voltage detector detects a difference between a voltage of the third terminal and a voltage of the fourth terminal.

4. The voltage detection circuit according to claim 3, further comprising:
   a multiplexer which selectively transmits one of pairs of voltages to the voltage detector, the pairs of voltages being composed of a pair of the voltage of the first terminal and the voltage of the second terminal and a pair of the voltage of the third terminal and the voltage of the fourth terminal, wherein the voltage detector detects the difference between the voltage of the third terminal and the voltage of the fourth terminal by detecting a difference between voltages in the one of pairs selectively transmitted by the multiplexer.

5. The voltage detection circuit according to claim 3, further comprising:
a multiplexer which selectively transmits one of pairs of voltages to the voltage detector, the pairs of voltages including the pair of the voltage of the first terminal and the voltage of the second terminal and the pair of the voltage of the third terminal and the voltage of the fourth terminal,
wherein the voltage detector detects the difference between the voltage of the third terminal and the voltage of the fourth terminal by detecting a difference between voltages in the one of pairs selectively transmitted by the multiplexer.

6. The voltage detection circuit according to claim 1, wherein the voltage detector converts the voltage of the first terminal and the voltage of the second terminal into digital values.

7. An abnormality detector, comprising:
the voltage detection circuit according to claim 1;
the first resistor;
a fifth terminal for connecting to the one end of the first voltage detection line;
a first connection path which connects the first terminal to the fifth terminal through the first resistor;
a second connection path which connects the second terminal to the fifth terminal without the first resistor, and
an abnormality determination circuit which detects connection abnormality of the first voltage detection line based on the voltage of the first terminal and the voltage of the second terminal.

8. The abnormality detector according to claim 7, wherein the abnormality determination circuit detects a difference between the voltage of the first terminal and the voltage of the second terminal.

9. The abnormality detector according to claim 7, wherein the abnormality determination circuit detects abnormality after a predetermined time until feed or draw of current is stopped and the voltage input into the abnormality detector is returned to a normal individual battery voltage value.

10. The abnormality detector according to claim 7, wherein after measurement of abnormality of one individual battery, the abnormality determination circuit sequentially determines abnormality of other individual batteries, and determines the abnormality of the one individual battery after determination of the abnormality of all of the other individual batteries.

11. The abnormality detector according to claim 7,
wherein the voltage detection circuit includes a second voltage detection line having one end and another end, the another end being connected to a cathode or an anode of a second individual battery connected in series to the cathode of the first individual battery, and
the abnormality determination circuit simultaneously determines abnormality of the first voltage detection line and abnormality of the second voltage detection line.

12. The abnormality detector according to claim 7, wherein the abnormality determination circuit determines abnormality after the current is drawn into the fifth terminal and then is feed from the fifth terminal.

13. A battery system, comprising:
the abnormality detector according to claim 7;
the first individual battery; and
the first voltage detection line,
wherein the another end of the first voltage detection line is connected to the cathode or the anode of the first individual battery, and
the one end of the first voltage detection line is connected to the fifth terminal.

14. The voltage detection circuit according to claim 1, wherein the first current generating circuit feeds current into the first voltage detection line to detect abnormality of the first voltage detection line.

* * * * *